(12) United States Patent
Lue

(10) Patent No.: US 11,133,329 B2
(45) Date of Patent: *Sep. 28, 2021

(54) 3D AND FLASH MEMORY ARCHITECTURE WITH FEFET

(71) Applicant: MACRONIX INTERNATIONAL CO., LTD., Hsinchu (TW)

(72) Inventor: Hang-Ting Lue, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/989,584

(22) Filed: Aug. 10, 2020

(65) Prior Publication Data

US 2021/0074726 A1 Mar. 11, 2021

Related U.S. Application Data

(60) Provisional application No. 62/897,402, filed on Sep. 9, 2019.

(51) Int. Cl.
*H01L 27/11* (2006.01)
*H01L 27/11597* (2017.01)
(Continued)

(52) U.S. Cl.
CPC ......... *H01L 27/11597* (2013.01); *G11C 7/18* (2013.01); *G11C 8/14* (2013.01);
(Continued)

(58) Field of Classification Search
None
See application file for complete search history.

(56) References Cited

U.S. PATENT DOCUMENTS 8,223,548 B2 7/2012 Hayashi et al.
8,432,719 B2 4/2013 Lue
(Continued)

FOREIGN PATENT DOCUMENTS

CN 101689547 B 6/2012
CN 109037231 A 12/2018
(Continued)

OTHER PUBLICATIONS

Lue et al., "Device Modeling of Ferroelectric Memory Field-Effect Transistor (FeMFET)," IEEE Trans. on Electron Devices, vol. 49, No. 10, Oct. 2002, 9 pages.
(Continued)

*Primary Examiner* — Tan T. Nguyen
(74) *Attorney, Agent, or Firm* — Haynes Beffel & Wolfeld LLP; Andrew L. Dunlap

(57) ABSTRACT

A 3D flash memory is provided to includes a gate stack structure comprising a plurality of gate layers electrically insulated from each other, a cylindrical channel pillar vertically extending through each gate layer of the gate stack structure, a first conductive pillar vertically extending through the gate stack structure, the first conductive pillar being located within the cylindrical channel pillar and being electrically connected to the cylindrical channel pillar, and a second conductive pillar extending through the gate stack structure, the second conductive pillar being located within the cylindrical channel pillar and being electrically connected to the cylindrical channel pillar, the first conductive pillar and the second conductive pillar being separated from each other. The 3D flash memory also includes a ferroelectric layer disposed between gate layers of the gate stack structure and the cylindrical channel pillar.

20 Claims, 15 Drawing Sheets

(51) Int. Cl.
*H01L 27/11587* (2017.01)
*G11C 7/18* (2006.01)
*G11C 11/22* (2006.01)
*G11C 8/14* (2006.01)
*H01L 27/1159* (2017.01)

(52) U.S. Cl.
CPC ...... *G11C 11/2297* (2013.01); *H01L 27/1159* (2013.01); *H01L 27/11587* (2013.01)

(56) References Cited

U.S. PATENT DOCUMENTS

| | | | |
|---|---|---|---|
| 8,488,387 | B2 | 7/2013 | Lue et al. |
| 8,630,114 | B2 | 1/2014 | Lue |
| 8,824,212 | B2 | 9/2014 | Lue |
| 9,281,044 | B2 | 3/2016 | Ramaswamy et al. |
| 9,337,210 | B2 | 5/2016 | Karda et al. |
| 9,425,324 | B2 | 8/2016 | Diaz et al. |
| 9,837,435 | B1 | 12/2017 | Chang et al. |
| 10,096,619 | B2 | 10/2018 | Ino et al. |
| 10,157,671 | B1 | 12/2018 | Lung et al. |
| 10,381,375 | B2 | 8/2019 | Choi |
| 10,403,631 | B1 | 9/2019 | Lu et al. |
| 10,734,409 | B2 | 8/2020 | Yoo |
| 2007/0236979 | A1* | 10/2007 | Takashima ............ H01L 27/105 365/145 |
| 2015/0070964 | A1* | 3/2015 | Yamada .................. H01L 21/84 365/145 |
| 2015/0318301 | A1 | 11/2015 | Lee et al. |
| 2017/0148517 | A1 | 5/2017 | Harari |
| 2020/0203381 | A1* | 6/2020 | Rabkin ............. H01L 21/02172 |
| 2020/0381450 | A1 | 12/2020 | Lue et al. |

FOREIGN PATENT DOCUMENTS

| | | | |
|---|---|---|---|
| CN | 109712983 | A | 5/2019 |
| CN | 110071117 | A | 7/2019 |
| TW | 201613090 | A | 4/2016 |
| TW | I530946 | B | 4/2016 |
| TW | 201639149 | A | 11/2016 |
| TW | I560885 | B | 12/2016 |
| TW | 201909390 | A | 3/2019 |
| TW | I718077 | | 2/2021 |

OTHER PUBLICATIONS

Mulaosmanovic, et al., "Ferroelectric FETs With 20-nm-Thick HfO2 Layer for Large Memory Window and High Performance," IEEE Trans. on Electron Devices, vol. 66, Issue 9, Sep. 2019, 6 pages.

Du et al., "Pulse-IV Characterization of Charge-Transient Behavior of SONOS-Type Devices With or Without a Thin Tunnel Oxide," in IEEE Electron Device Letters, vol. 30, No. 4, pp. 380-382, Apr. 2009.

Lue et al., "Radically extending the cycling endurance of Flash memory (to > 100M Cycles) by using built-in thermal annealing to self-heal the stress-induced damage," 2012 International Electron Devices Meeting, San Francisco, CA, USA, Dec. 2012, p. 9.1.1-9.1.4.

TW Office Action from Application No. 11020213020 with English Translation dated Mar. 8, 2021, 10 pages.

\* cited by examiner

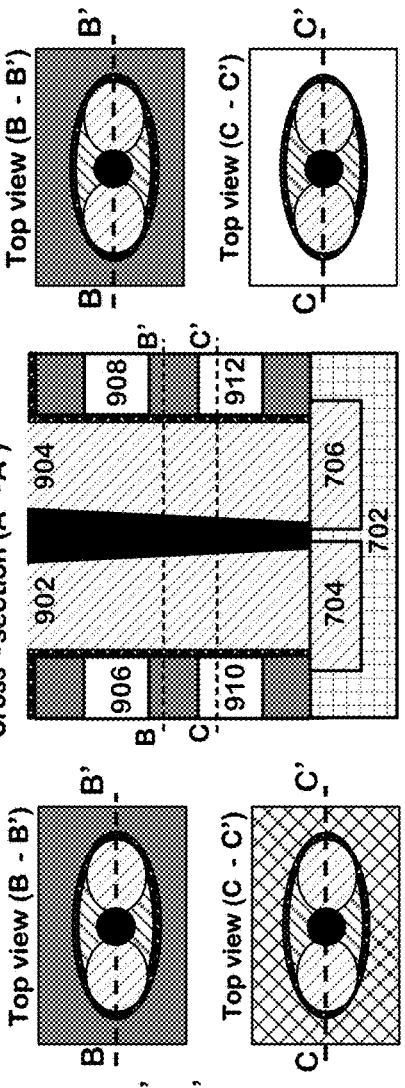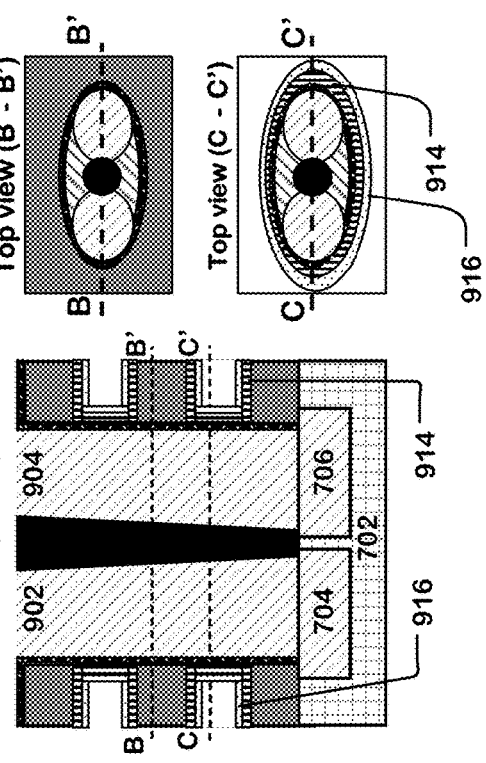
FIG. 9

3D AND FLASH MEMORY ARCHITECTURE WITH FEFET

PRIORITY APPLICATION

This application claims the benefit of U.S. Provisional Patent Application No. 62/897,402 filed 9 Sep. 2019; which application is incorporated herein by reference.

BACKGROUND

Field of Invention

The present invention relates to 3D flash memory and in particular relates to 3D AND or 3D NOR flash memory architecture and control logic.

Description of Related Art

Non-volatile memory (such as a flash memory) is widely used in personal computers and other electronic devices because it has an advantage that the stored data does not disappear after the computer and/or devices are powered off.

As 3D AND flash memory becomes ever increasingly used in electronic devices, a need arises to develop a 3D AND flash memory that is smaller, so that larger memory capacities can be implemented in electronic devices, even as they themselves become smaller. Further another need arises to develop an 3D AND flash memory that is more efficient and that operates at higher speeds. The increased efficiency allows battery operated electronics to operate longer on a single charge and the increase speed allows the electronic devices to operate faster.

Therefore, it is desirable to provide a 3D AND flash memory architecture that is smaller, more efficient and faster. The technology disclosed achieves these characteristics by forming cylindrical channel pillars and by implementing ferroelectric materials to form Ferroelectric Field Effect Transistors (FeFET). The cylindrical channel pillars can be elliptically shaped, circularly shaped or some other type of shape.

SUMMARY

The present invention provides a 3D flash memory. The 3D flash memory includes a gate stack structure comprising a plurality of gate layers electrically insulated from each other, a cylindrical channel pillar vertically extending through each gate layer of the gate stack structure, a first conductive pillar vertically extending through the gate stack structure, the first conductive pillar being located within the cylindrical channel pillar and being electrically connected to the cylindrical channel pillar, a second conductive pillar vertically extending through the gate stack structure, the second conductive pillar being located within the cylindrical channel pillar and being electrically connected to the cylindrical channel pillar, the first conductive pillar and the second conductive pillar being separated from each other; and a ferroelectric layer disposed between gate layers of the gate stack structure and the cylindrical channel pillar. The cylindrical channel pillar can be elliptical (elliptically shaped) or circular (circularly shaped) or of another type of shape. The 3D architecture described throughout this document can be implemented as a 3D AND or a 3D NOR device. While 3D AND is primarily describe the technology disclosed is not limited thereto and can also be implemented as a 3D NOR device.

According to an aspect of the technology disclosed, an insulating pillar is disposed within the cylindrical channel pillar and between the first conductive pillar and the second conductive pillar.

According to another aspect of the technology disclosed, a first buried conductor is disposed horizontally under the gate stack and is electrically connected to the first conductive pillar, and a second buried conductor is disposed horizontally under the gate stack and is electrically connected to the second conductive pillar.

Further, according to one aspect of the technology disclosed, the ferroelectric layer vertically extends through the gate stack structure.

In one aspect of the technology disclosed the ferroelectric layer is on an upper surface and a lower surface of each gate layer of the plurality of gate layers.

In another aspect of the technology disclosed the ferroelectric layer covers an outer surface of the cylindrical channel pillar.

Moreover, according to an aspect of the technology disclosed the cylindrical channel pillar is continuous in a vertical direction.

According to an aspect of the technology disclosed the ferroelectric layer is comprised of a ferroelectric $HfO_2$ material.

In a further aspect of the technology disclosed, the 3D flash memory can include an insulator disposed between the first conductive pillar and the second conductive pillar and extending along a length of the first conductive pillar and the second conductive pillar. The insulator can separate the first conductive pillar and the second conductive pillar from one another.

In another aspect, the 3D flash memory includes a first buried conductor disposed in a dielectric base onto which the gate stack structure is disposed and connected to the first conductive pillar, a second buried conductor disposed in the dielectric base and connected to the second conductive pillar, and a control circuit. The control circuit is configured to perform a program operation on the 3D flash memory by: providing a voltage of approximately +5 volts to +8 volts on a selected word line connected to a selected gate layer of the plurality of gate layers; providing a voltage of approximately 0 volts on a selected source line connected to the first buried conductor connected to the first conductive pillar within the cylindrical channel pillar; and providing a voltage of approximately 0 volts on a selected bit line connected to the second buried conductor connected to the second conductive pillar within the cylindrical channel pillar.

In one aspect, the 3D flash memory includes an insulator disposed between the first conductive pillar and the second conductive pillar and extending along a length of the first conductive pillar and the second conductive pillar, the insulator separating the first conductive pillar and the second conductive pillar from one another.

In a further aspect, the 3D flash memory includes a control circuit. The control circuit is configured to perform an erase operation on the 3D flash memory by: providing a voltage $V_{ERS}$ of approximately −5 volts to −8 volts on a selected word line connected to a selected gate layer of the plurality of gate layers; providing a voltage of approximately 0 volts on a selected source line connected to the first conductive pillar within the cylindrical channel pillar; and providing a voltage of approximately 0 volts on a selected bit line connected to the second conductive pillar within the cylindrical channel pillar.

In another aspect, control circuit is further configured to perform the erase operation on the 3D flash memory by:

providing a voltage of approximately 0 volts to deselected word lines connected to gate layers of the plurality of gate layers, except for the selected gate layer; providing a voltage of approximately $(0.5) \times V_{ERS}$ volts to a deselected source line connected to a third conductive pillar within a second cylindrical channel pillar; and providing a voltage of approximately $(0.5) \times V_{ERS}$ volts to a deselected bit line connected to a fourth conductive pillar within the second cylindrical channel pillar.

In one aspect the 3D flash memory further includes a second cylindrical channel pillar having the same structure and arrangement as the cylindrical channel pillar, a third conductive pillar having the same structure and arrangement as the first conductive pillar, a fourth conductive pillar having the same structure and arrangement as the second conductive pillar, a control circuit. The control circuit is configured to perform a read operation on the 3D flash memory by: providing a voltage of approximately +2 volts to +4 volts on a selected word line connected to a selected gate layer of the plurality of gate layers; providing a voltage of approximately 0 volts selected and deselected source lines connected to the first conductive pillar within the cylindrical channel pillar and connected to the third conductive pillar within the second cylindrical channel pillar; and providing a voltage of approximately +0.5 volts to +1.5 volts on a selected bit line connected to the third conductive pillar within the cylindrical channel pillar.

According to another aspect, the control circuit is further configured to perform the read operation on the 3D flash memory by: providing a voltage of approximately 0 volts to −2 volts to deselected word lines connected to gate layers of the plurality of gate layers, except for the selected gate layer; and providing a voltage of approximately 0 volts to a deselected bit line connected to the fourth conductive pillar within the second cylindrical channel pillar.

Further, in another aspect, a control circuit configured to program, erase and read a 3D flash memory is provided. The 3D flash memory includes a gate stack structure comprising a plurality of gate layers electrically insulated from each other, a cylindrical channel pillar vertically extending through each gate layer of the gate stack structure, a first conductive pillar vertically extending through the gate stack structure, the first conductive pillar being located within the cylindrical channel pillar and being electrically connected to the cylindrical channel pillar, a second conductive pillar vertically extending through the gate stack structure, the second conductive pillar being located within the cylindrical channel pillar and being electrically connected to the cylindrical channel pillar, the first conductive pillar and the second conductive pillar being separated from each other, and a ferroelectric layer disposed between each gate layer of the gate stack structure and the cylindrical channel pillar. Additionally, the control circuit is configured to variously perform program, erase and read operations by: providing various voltages to a selected word line connected to a selected gate layer of the gate stack structure of the 3D flash memory; providing various voltages to a selected bit line connected to the second conductive pillar within the cylindrical channel pillar of the 3D flash memory; and providing various voltages to a selected source line connected to the first conductive pillar within the cylindrical channel pillar of the 3D flash memory.

Additionally, a method of forming a gate stack including a dielectric layer and a ferroelectric layer is provided. The method can include forming a gate stack structure comprising a plurality of gate layers electrically insulated from each other, forming a cylindrical channel pillar vertically extending through each gate layer of the gate stack structure, forming a first conductive pillar vertically extending through the gate stack structure, the first conductive pillar being located within the cylindrical channel pillar and being electrically connected to the cylindrical channel pillar, forming a second conductive pillar vertically extending through the gate stack structure, the second conductive pillar being located within the cylindrical channel pillar and being electrically connected to the cylindrical channel pillar, forming an insulating pillar disposed within the cylindrical channel pillar and between the first conductive pillar and the second conductive pillar, and forming a ferroelectric layer disposed between gate layers of the gate stack structure and the cylindrical channel pillar.

Moreover, according to an aspect of the method, the ferroelectric lay can vertically extend through the gate stack structure.

According to a further aspect of the method, a cross-section of the ferroelectric layer is a cylinder, and wherein the ferroelectric layer surrounds an outer surface of the cylindrical channel pillar.

In one aspect, the method further includes disposing a first buried conductor in a dielectric base onto which the gate stack structure is disposed, the first buried conductor being connected to the first conductive pillar, and disposing a second buried conductor in the dielectric base, the second buried conductor being connected to the first conductive pillar.

In another aspect the channel layer forms a vertically extending channel pillar that is continuous in a vertical direction.

Other aspects and advantages of the present invention can be seen on review of the drawings, the detailed description and the claims, which follow.

BRIEF DESCRIPTION OF THE DRAWINGS

FIG. 9 illustrates various steps performed to manufacture a gate stack structure of a 3D AND flash memory according to a first process.

DETAILED DESCRIPTION

A detailed description of embodiments of the present invention is provided with reference to the FIGS. 1-15.

Figure 1:
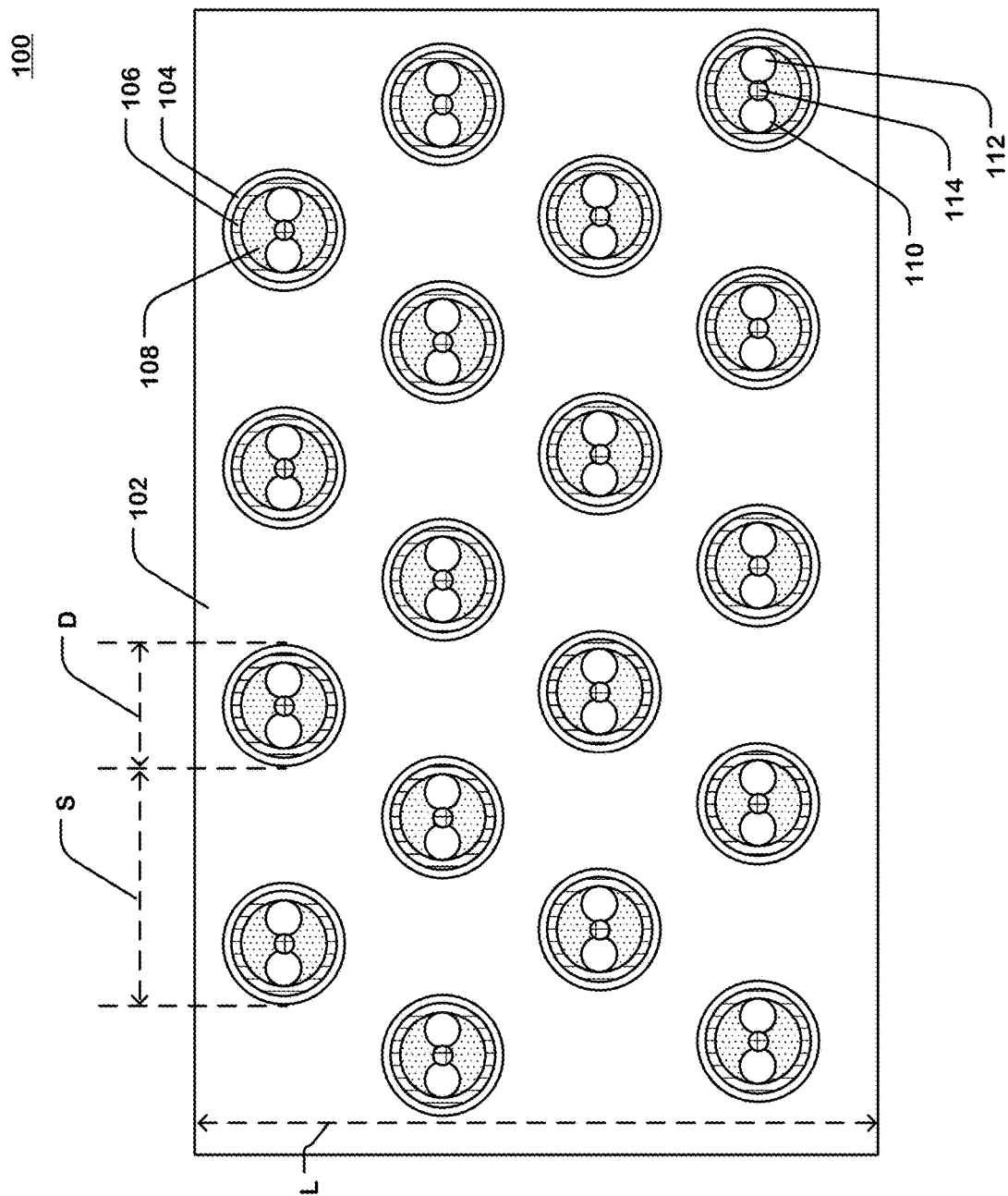
FIG. 1 is a schematic top view of a 3D AND flash memory having a cylindrical channel pillar structure.

FIG. 1 is a schematic top view of a 3D AND flash memory having a cylindrical channel pillar structure.

Specifically, FIG. 1 illustrates a top view of a (ferroelectric) 3D AND flash memory 100 that includes an insulating layer 102 comprised of, for example, silicon oxide. Below the insulating layer 102 lies a stack structure (not illustrated). Further, the 3D AND flash memory 100 includes a memory material 104 formed on an inner surface of an opening created during the process of manufacturing the 3D AND flash memory 100. The 3D AND flash memory 100 also includes a circular channel pillar 106 formed inside the memory material 104. In one embodiment, the memory material 104 can be continuous along the circular channel pillar 106, allowing 102 to be an insulating layer or a gate layer. In another embodiment (not illustrated), the memory material 104 can be on an upper surface and a lower surface of a gate layer (e.g., 102 is a gate layer in this embodiment and the memory material 104 is on an upper surface and a lower surface of 102).

Additionally, the 3D AND flash memory 100 includes an insulating layer 108 comprised of, for example, silicon oxide. The 3D AND flash memory 100 also includes a first conductive pillar 110 that can be a source pillar or a drain pillar, a second conductive pillar 112 that can be a source pillar or a drain pillar and an insulator 114 arranged between the first conductive pillar 110 and the second conductive pillar 112. A combination of the memory material 104, the channel pillar 106, the insulating layer 108, the first conductive pillar 110, the second conductive pillar 112 and the insulator 114 can be referred to as a vertical channel that extends through the stack structure.

Figure 2:
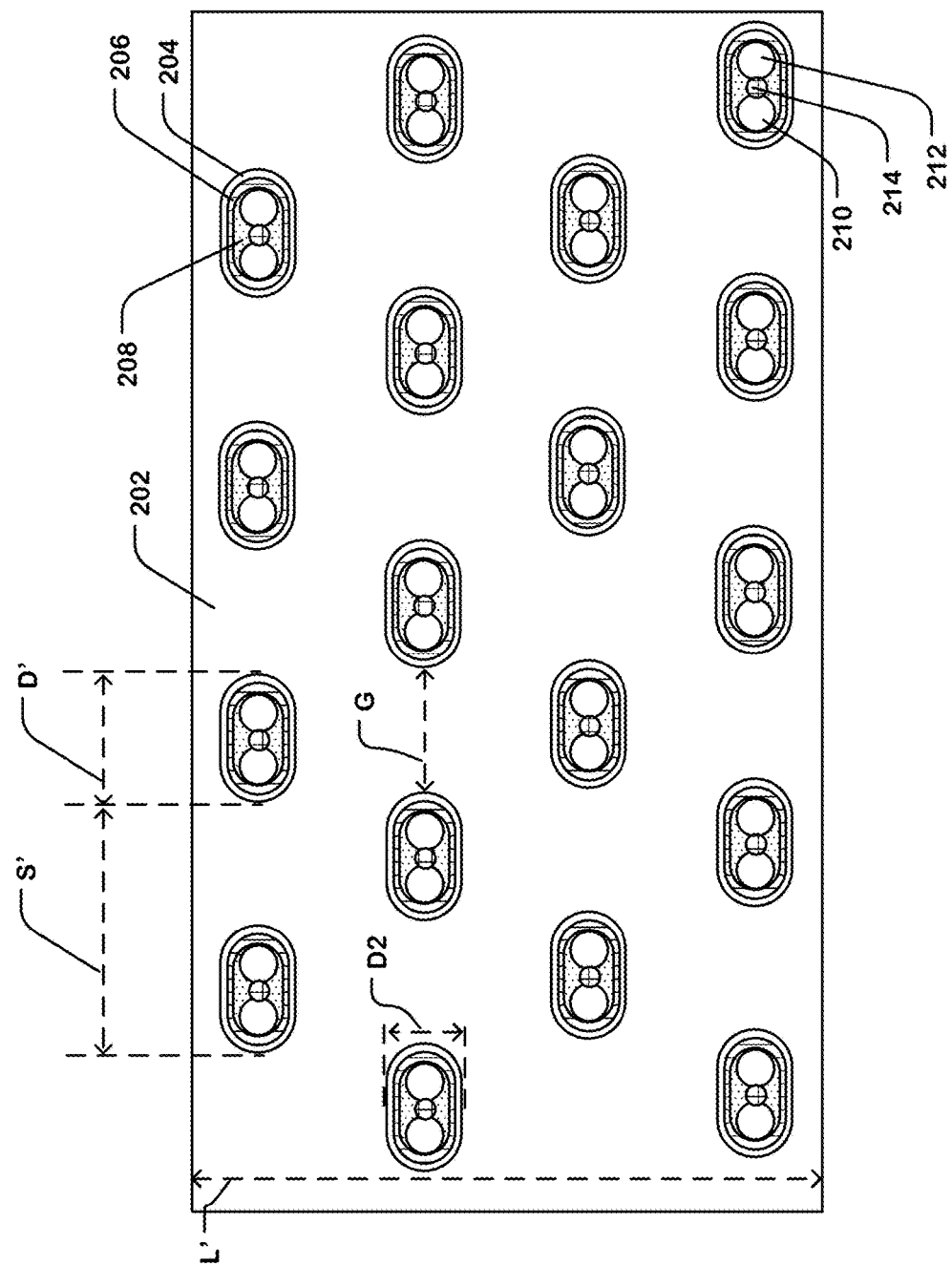
FIG. 2 is a schematic top view of a 3D AND flash memory having an elliptically shaped cylindrical channel pillar structure, according to an aspect of the technology disclosed.

As illustrated, this 3D AND flash memory 100 includes several vertical channels. Example dimensions are illustrated with respect to the structure of the 3D AND flash memory 100 and the vertical channels. These dimensions are only for exemplary purposes, are not to scale and are provided only in order to illustrate the space and size reduction that can be achieved by the technology disclosed (e.g., see description of FIG. 2 provided below). For example, a diameter D of the memory material 104 can be 0.28 µm, a spacing S from a leftmost side of a particular vertical channel to a leftmost side of an adjacent vertical channel can be 0.32 µm and a length L of the 3D AND flash memory 100 can be 1.5 µm. The Unit Vertical Channel Area can be calculated as (S×L)/(number of rows of vertical channels). Using the example measurements from above, the Unit Vertical Channel Area equals (0.32 µm×1.5 µm)/4, which is 0.12 µm².

The 3D architecture described throughout this document can be implemented as a 3D AND or a 3D NOR device. While 3D AND is primarily describe the technology disclosed is not limited thereto and can also be implemented as a 3D NOR device.

FIG. 2 is a schematic top view of a (ferroelectric) 3D AND flash memory having an elliptically shaped cylindrical channel pillar structure, according to an aspect of the technology disclosed.

Specifically, FIG. 2 illustrates a top view of 3D AND flash memory 200 that is able to decrease the size (footprint) of the vertical channels, which allows more memory to be packed into a space than the 3D AND flash memory 100 of FIG. 1. The 3D AND flash memory includes an insulating layer 202 comprised of, for example, silicon oxide. Below the insulating layer 202 lies a stack structure (not illustrated here, but illustrated in subsequent figures). Further, the 3D AND flash memory 200 includes a memory material 204 formed on an inner surface of an opening created during the process of manufacturing the 3D AND flash memory 200. As discussed below in more detail, the memory material 204 can be a ferroelectric layer, which improves efficiency and performance of the 3D AND flash memory 200. The 3D AND flash memory 200 also includes an elliptically shaped cylindrical channel pillar 206 formed inside the memory material 204. The memory material 204 is also elliptically shaped cylindrical. In other words, both the elliptically shaped cylindrical channel pillar 206 and the elliptically shaped cylindrical memory material 204 can have elliptical cross-sections, as opposed to the circular cross-sections of the memory material 104 and the channel pillar 106 illustrated in FIG. 1. With respect to the cross-sections mentioned above, note that the cylindrical channel pillar 206 and the cylindrical memory materials 204 have a cross-section that is orthogonal to a longitudinal axis of the cylinder (206, 204) and that cross-section can be circular, elliptical, rectangular or other polygonal. This cross-section can be elongated so as to encompass the vertical source/drain conductors in one direction but have a reduced pitch in an orthogonal direction. A structure is cylindrical when it has a structure like a cylinder within variations due to practicalities of manufacturing and layout. The above-described cross-sectional structure can be applied to any cylindrical channel pillar memory materials described herein. This elliptical shape is what allows the 3D AND flash memory 200 to have increased storage capacity than an equally sized 3D AND flash memory 100. In one embodiment, the memory material 204 can be continuous along the circular channel pillar 206, allowing 202 to be an insulating layer or a gate layer. In another embodiment (not illustrated), the memory material 204 can be on an upper surface and a lower surface of a gate layer (e.g., 202 is a gate layer in this embodiment and the memory material 204 is on an upper surface and a lower surface of 202).

Further, the 3D AND flash memory 200 includes an insulating layer 208 comprised of, for example, silicon oxide. The 3D AND flash memory 200 also includes a first conductive pillar 210, a second conductive pillar 212 and an insulator 214 arranged between the first conductive pillar 210 and the second conductive pillar 212. As illustrated, the first conductive pillar 210 and the second conductive pillar 212 are separated from one another by both the insulator 214 and the insulating layer 208. A combination of the elliptically shaped cylindrical memory material 204, the elliptically shaped cylindrical channel pillar 206, the insulating layer 208, the first conductive pillar 210, the second conductive pillar 212 and the insulator 214 can be referred to as a vertical channel that extends through the stack structure.

As illustrated, this 3D AND flash memory 200 includes several vertical channels. Example dimensions are illustrated with respect to the structure of the 3D AND flash memory 200 and the vertical channels. These dimensions are only for exemplary purposes, are not to scale and are provided only in order to illustrate the space and size reduction that can be achieved by the technology disclosed in comparison to the 3D AND flash memory 100. For example, a diameter D' (i.e., major axis diameter) of the elliptically shaped memory material 204 can be 0.28 µm, a spacing S' from a leftmost side of a particular vertical channel to a leftmost side of an adjacent vertical channel can be 0.32 µm and a length L' of the 3D AND flash memory 200 can be 0.98 µm. The Unit Vertical Channel Area can be calculated as (S×L)/(number of rows of vertical channels). Using the example measurements from above, the Unit Vertical Channel Area equals (0.32 µm×0.98 µm)/4, which is 0.0784 µm$^2$.

When comparing to the Unit Vertical Channel Area of the 3D AND flash memory 100 of 0.12 µm$^2$ to the Unit Vertical Cannel Area of the 3D AND flash memory 200 of 0.0784 µm$^2$, it is clear that the 3D flash memory 200 can offer a 35% savings in area compared to the 3D AND flash memory 100. This savings allows more memory to fit in a space and/or allows for smaller memories that leave more room for other components of an electronic device.

Additionally, a gap G between the vertical channels can be, for example 0.04 µm and a minor axis diameter D2 of the vertical channels can be, for example, 0.15 µm.

Further, the elliptically shaped cylindrical channel pillar 206 and the elliptically shaped memory material 204 can be circular (circularly shaped) or of another type of shape. This applies to all elliptical structures described throughout this document.

Figure 3:
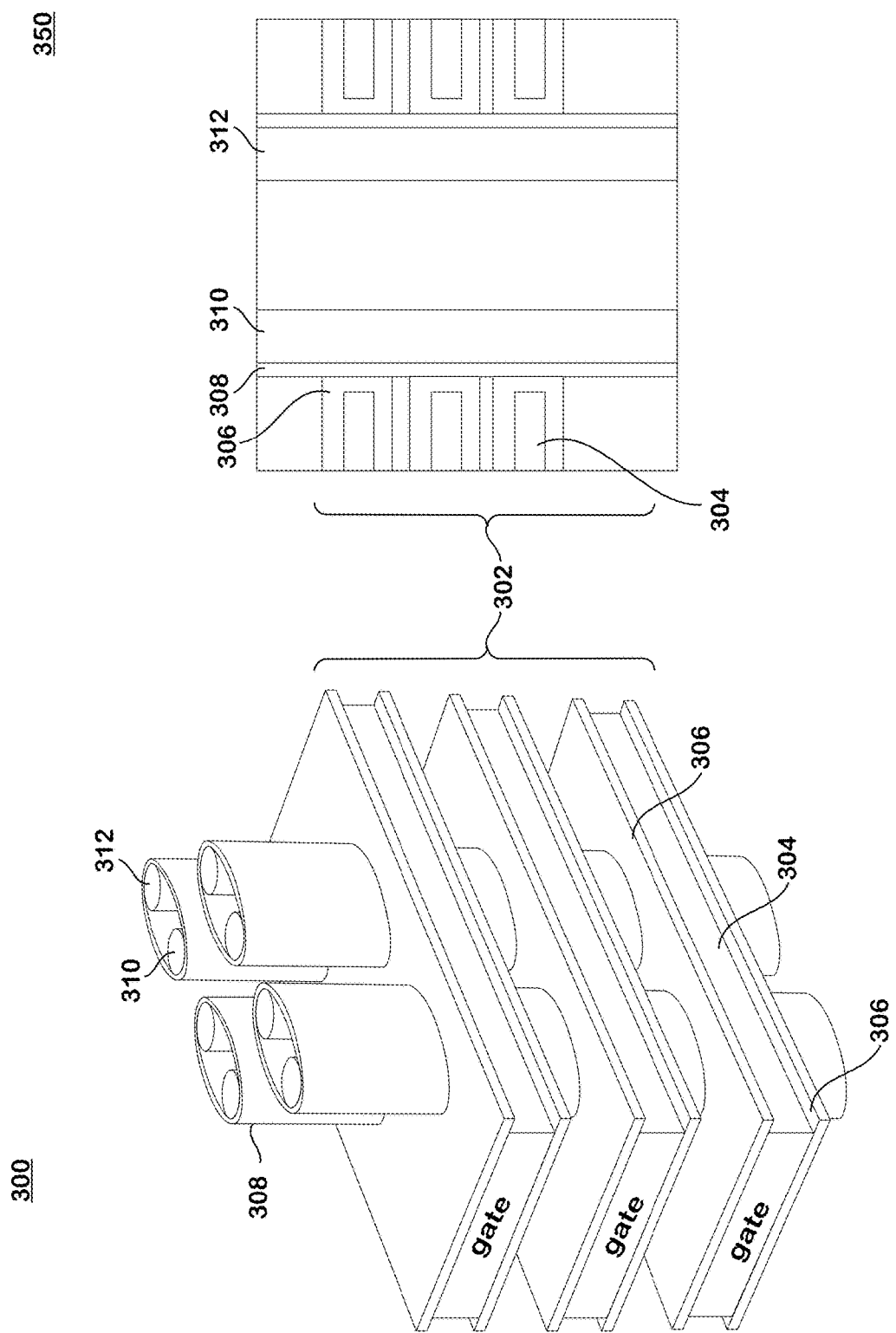
FIG. 3 provides an orthogonal illustration of a 3D AND flash memory having an elliptically shaped channel pillar structure and a corresponding cross-sectional view of an elliptically shaped channel pillar and gate stack structure, according to an aspect of the technology disclosed.

FIG. 3 provides an orthogonal illustration of a 3D AND flash memory having an elliptically shaped cylindrical channel pillar structure and a corresponding cross-sectional view of an elliptically shaped cylindrical channel pillar and gate stack structure, according to an aspect of the technology disclosed.

Specifically, FIG. 3 includes an orthogonal view 300 of a 3D AND flash memory and a cross-sectional view 350 of the 3D AND flash memory. The 3D AND flash memory includes a gate stack structure 302, which includes a plurality of gate layers 304, where the gate layers 304 are electrically insulated from one another by an insulator. However, the insulator between each of the gate layers 304 is not illustrated in FIG. 3. In this aspect of the technology disclosed, ferroelectric layers 306 are on upper surfaces and a lower surfaces of the gate layers 304. FIG. 3 illustrates three gate layers 304. However, a 3D AND memory may have any number of gate layers 304.

Additionally, the 3D AND flash memory includes a plurality of elliptically shaped cylindrical channel pillars 308. FIG. 3 illustrates four elliptically shaped cylindrical channel pillars 308. However, a 3D AND flash memory may have any number of elliptically shaped cylindrical channel pillars 308. The elliptically shaped cylindrical channel pillars 308 vertically extend through each gate layer 304 of the gate stack structure 302. As illustrated, a cross-section of the elliptically shaped cylindrical channel pillar 308 is an elliptical cylinder. Additionally, in this aspect of the technology disclosed and as illustrated in the cross-sectional view 350, the ferroelectric layers 306 also contact the elliptically shaped cylindrical channel pillars 308 (i.e., the ferroelectric layers 306 are disposed between the gate layers 304 and the elliptically shaped cylindrical channel pillars 308). The process of forming this structure illustrated in FIG. 3 is illustrated in FIGS. 7-10 and is discussed in detail below. In another aspect of the technology disclosed, the ferroelectric layers 306 cover/surround outer surfaces of the elliptically shaped cylindrical channel pillars 308. The process of forming this alternate structure is illustrated in FIGS. 11-14 and is discussed in detail below.

Turing back to FIG. 3, a first conductive pillar 310 that can be a source pillar or a drain pillar is disposed/located within each elliptically shaped cylindrical channel pillar 308, where each first conductive pillar 310 also vertically extends through the gate stack structure 302. Further, a second conductive pillar 312 that can be a source pillar or a drain pillar is disposed/located within each elliptically shaped cylindrical channel pillar 308, where each second conductive pillar 312 also vertically extends through the gate stack structure 302. In other words, each elliptically shaped cylindrical channel pillar 308 includes a first conductive pillar 310 and a second conductive pillar 312 pair. As an alternative to what is illustrated in FIG. 3, the first conductive pillar 310 and the second conductive pillar 312 pair may be oriented such that the second conductive pillar 312 is to the left and the first conductive pillar 310 is on the right, within the elliptically shaped cylindrical channel pillar 308.

Additionally, the first conductive pillar 310 and the second conductive pillar 312 of each pair are separated from each other within the elliptically shaped cylindrical channel pillar 308. Further, the first conductive pillar 310 and the second conductive pillar 312 are connected to the elliptically shaped cylindrical channel pillar 308. An insulating pillar (not illustrated) is disposed within each elliptically shaped cylindrical channel pillar 308 and between each first conductive pillar 310 and second conductive pillar 312 pair. In the same fashion as the elliptically shaped cylindrical channel pillars 308, the first conductive pillars 310 and the second conductive pillars 312 extend above and below the gate stack structure 302.

The elliptically shaped cylindrical channel pillars 308 can be continuous in the vertical direction in which they extend, meaning that the elliptically shaped cylindrical channel pillars 308 are integral in their extending direction and are not divided into a plurality of disconnected portions. Alternatively, the elliptically shaped cylindrical channel pillars 308 can be discontinuous in the vertical direction in which they extend, meaning that the elliptically shaped cylindrical channel pillars 308 are not integral in their extending direction and are divided into a plurality of disconnected portions.

The ferroelectric layers 306 can be comprised of a ferroelectric HfO$_2$ material, hafnium oxide, including, for example, silicon-doped hafnium oxide and zirconium-doped hafnium oxide, or any other ferroelectric type material that is known to a person of ordinary skill in the art. For example, the ferroelectric HfO$_2$ material can have an approximate thickness of 20 nm and can have an approximate micro coulomb per square centimeter (µC/cm$^2$) of 15-18.

Figure 4:
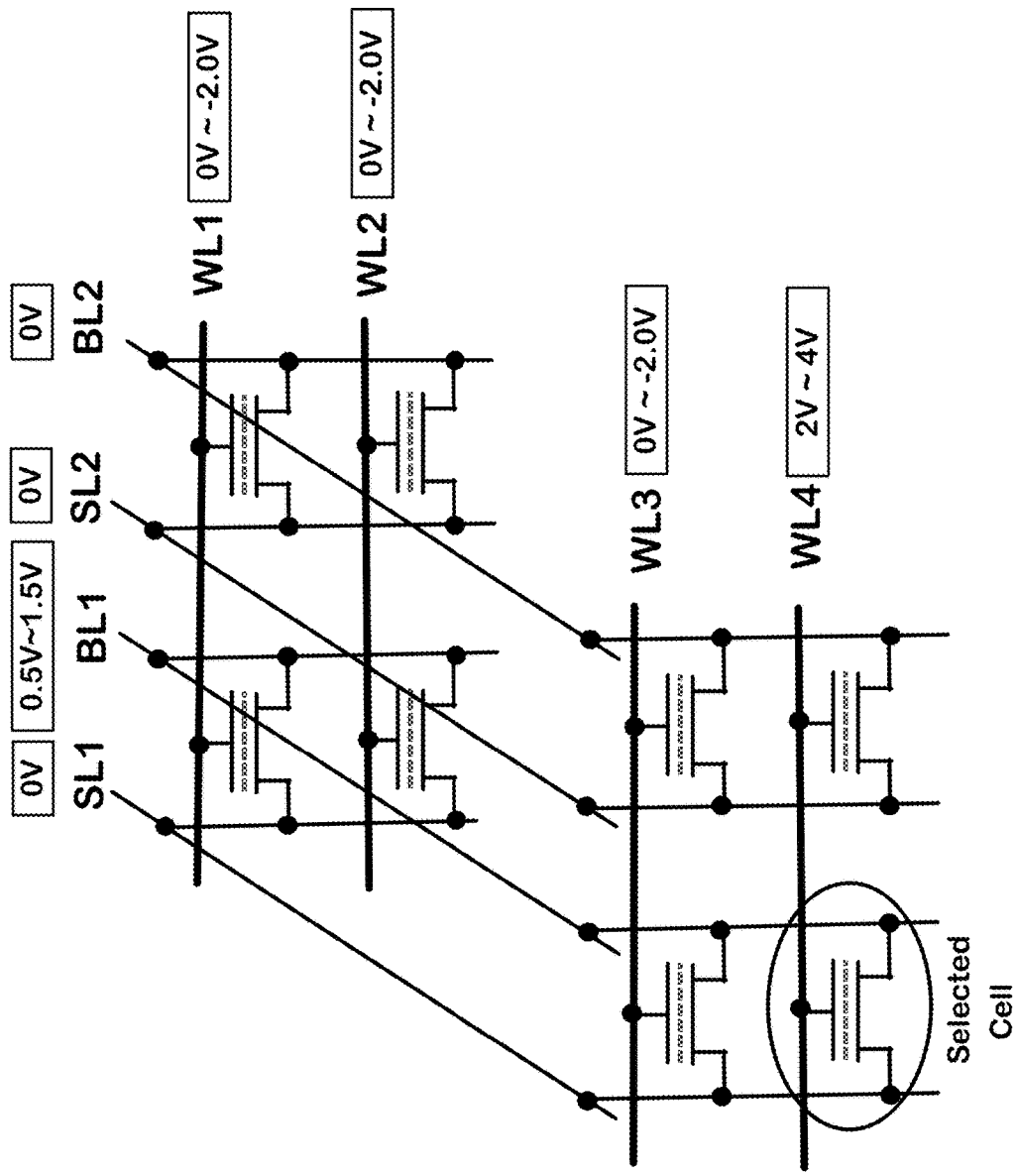
FIG. 4 illustrates various voltages applied to a 3D AND flash memory to perform a read operation, according to an aspect of the technology disclosed.

FIG. 4 illustrates various voltages applied to a 3D AND flash memory to perform a read operation, according to an aspect of the technology disclosed.

The 3D AND flash memory are configured to perform various operations, such as read, program (write) and erase.

Figure 15:
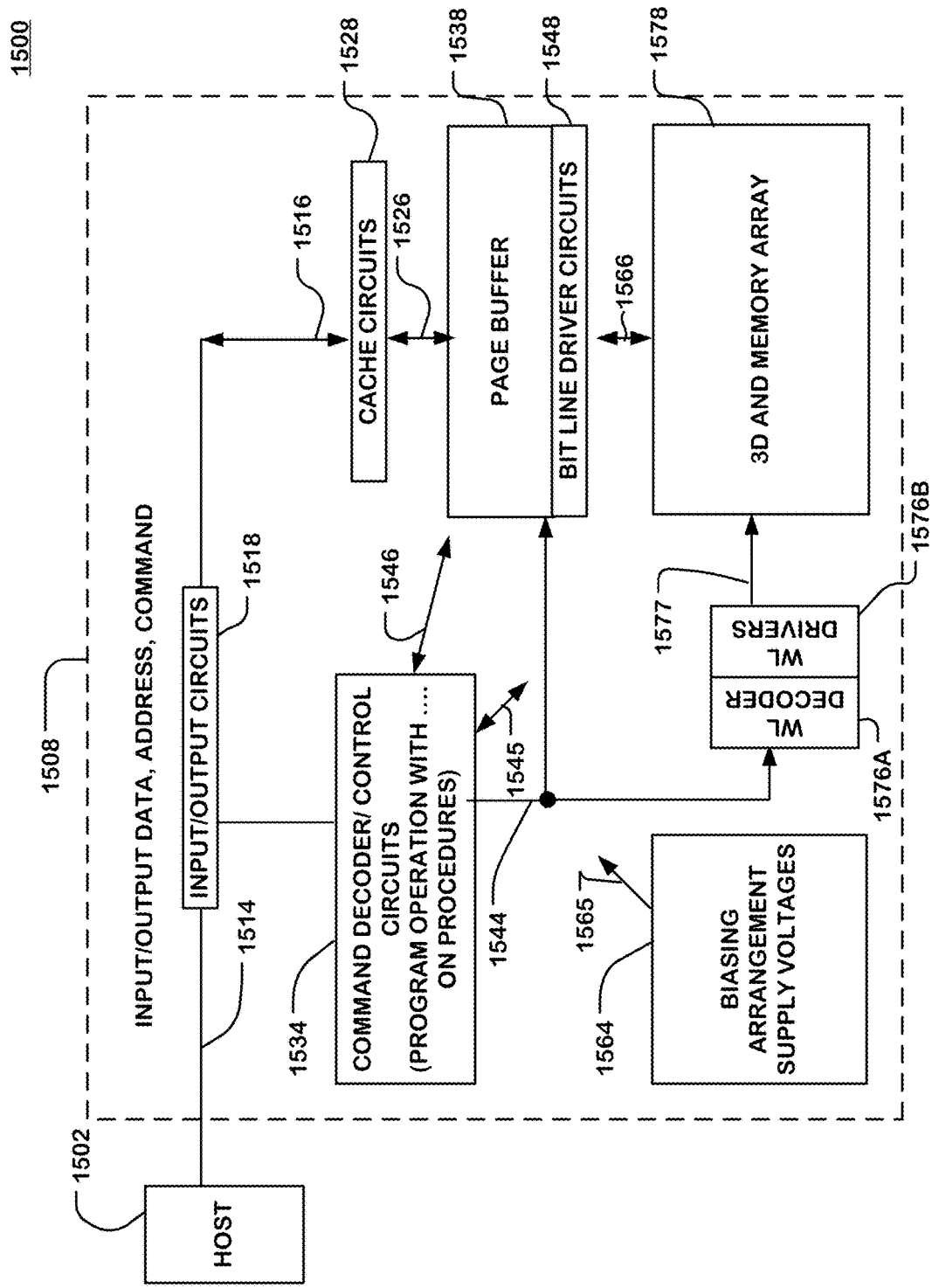
FIG. 15 illustrates a simplified block diagram of a 3D AND flash memory, host and a controller configured to perform operations on the 3D AND flash memory.

Controller circuitry is configured to provide specific electrical signals to various parts of the 3D AND flash memory in order to perform these various operations. Example controller circuitry is illustrated in FIG. 15 and is discussed in more detail below.

FIG. 4 illustrates source line SL1, bit line BL1, source line SL2 and bit line BL2. Source line SL1 corresponds, for example, to an electrical connection to first conductive pillar 310 of FIG. 3 or corresponds to the first conductive pillar 310 itself. Bit line BL1 corresponds, for example, to an electrical connection to second conductive pillar 312 of FIG. 3 or corresponds to the second conductive pillar 312 itself. Further, source line SL1 and bit line BL1 correspond to electrical connections to a first conductive pillar 310 and second conductive pillar 312 pair (or to the first conductive pillar 310 and second conductive pillar 312 pair itself) located within a particular elliptically shaped cylindrical channel pillar 308. In other words, source line SL1 and bit line BL1 are located within the same elliptically shaped cylindrical channel pillar 308.

Source line SL2 corresponds, for example, to an electrical connection to another first conductive pillar 310 of FIG. 3 or corresponds to the other first conductive pillar 310 itself. Bit line BL2 corresponds, for example, to an electrical connection to another second conductive pillar 312 of FIG. 3 or corresponds to the other second conductive pillar itself 312. Further, source line SL2 and bit line BL2 correspond to electrical connections to another first conductive pillar 310 and second conductive pillar 312 pair (or to the other first conductive pillar 310 and second conductive pillar 312 pair itself) located within a another elliptically shaped cylindrical channel pillar 308. In other words, source line SL2 and bit line BL2 are located within the same elliptically shaped cylindrical channel pillar 308.

FIG. 4 also illustrates four word lines including WL1, WL2, WL3 and WL4. The four word lines correspond to electrical connections to various gate layers (e.g., gate layers 304 of FIG. 3) or to the gate layers themselves.

As illustrated in FIG. 4, a cell is selected for the read operation. The selected cell of the 3D AND memory is located at the intersection of source line SL1, bit line BL1 and word line WL4. In order to perform a read operation on the selected cell (i) a selected word line voltage VwL of approximately 2V to 4V is applied to word line WL4, (ii) a de-selected word line voltage VcwL of approximately 0V to −2V is applied to non-selected word lines WL1, WL2 and WL3, (iii) a selected bit line voltage VBL of approximately 0.5V to 1.5V is applied to bit line BL1, (iv) a de-selected bit line voltage of 0V is applied to non-selected bit line BL2 and (v) a source line voltage of 0V is applied to source lines SL1 and SL2. The use of a negative voltage VcwL on the de-selected word lines WL1, WL2 and WL3 can avoid leakage current from the de-selected word lines WL1, WL2 and WL3. With the 3D AND flash memory structure described herein, a target read speeds on the order of approximately 100 ns can be achieved.

Figure 5:
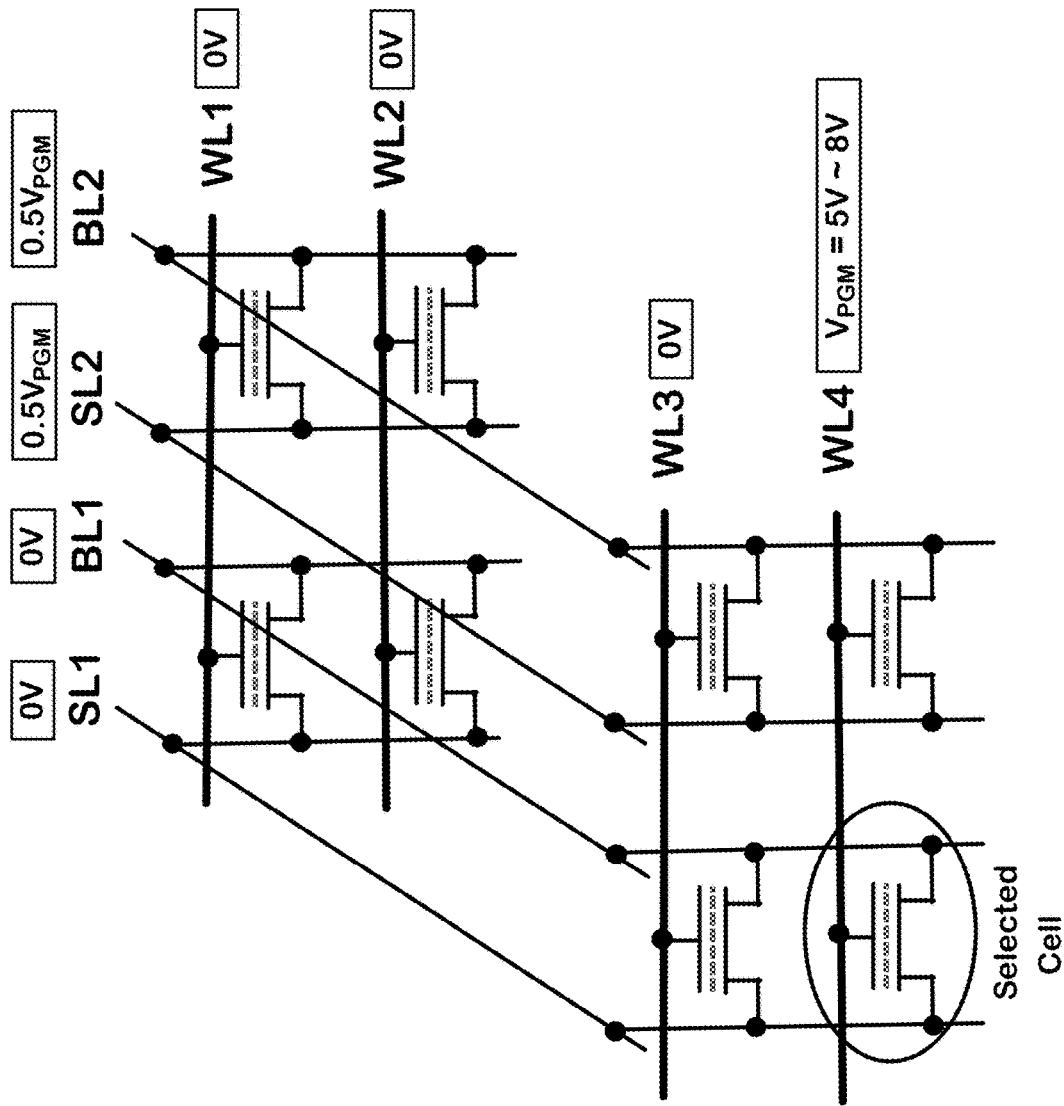
FIG. 5 illustrates various voltages applied to a 3D AND flash memory to perform a program operation, according to an aspect of the technology disclosed.

FIG. 5 illustrates various voltages applied to a 3D AND flash memory to perform a program (write) operation, according to an aspect of the technology disclosed.

The 3D AND flash memory is configured to perform various operations, such as read, program (write) and erase. Controller circuitry is configured to provide specific electrical signals to various parts of the 3D AND flash memory in order to perform these various operations. Example controller circuitry is illustrated in FIG. 15 and is discussed in more detail below.

FIG. 5 illustrates source line SL1, bit line BL1, source line SL2 and bit line BL2. Source line SL1 corresponds, for example, to an electrical connection to first conductive pillar 310 of FIG. 3 or corresponds to the first conductive pillar 310 itself. Bit line BL1 corresponds, for example, to an electrical connection to second conductive pillar 312 of FIG. 3 or corresponds to the second conductive pillar 312 itself. Further, source line SL1 and bit line BL1 correspond to electrical connections to a first conductive pillar 310 and second conductive pillar 312 pair (or to the first conductive pillar 310 and second conductive pillar 312 pair itself) located within a particular elliptically shaped cylindrical channel pillar 308. In other words, source line SL1 and bit line BL1 are located within the same elliptically shaped cylindrical channel pillar 308.

Source line SL2 corresponds, for example, to an electrical connection to another first conductive pillar 310 of FIG. 3 or corresponds to the other first conductive pillar 310 itself. Bit line BL2 corresponds, for example, to an electrical connection to another second conductive pillar 312 of FIG. 3 or corresponds to the other second conductive pillar itself. Further, source line SL2 and bit line BL2 correspond to electrical connections to another first conductive pillar 310 and second conductive pillar 312 pair (or to the other first conductive pillar 310 and second conductive pillar 312 pair itself) located within a another elliptically shaped cylindrical channel pillar 308. In other words, source line SL2 and bit line BL2 are located within the same elliptically shaped cylindrical channel pillar 308.

FIG. 5 also illustrates four word lines including WL1, WL2, WL3 and WL4. The four word lines correspond to electrical connections to various gate layers (e.g., gate layers 304 of FIG. 3) or to the gate layers themselves.

As illustrated in FIG. 5, a cell is selected for the program (write) operation. The selected cell of the 3D AND memory is located at the intersection of source line SL1, bit line BL1 and word line WL4. In order to perform a program (write) operation on the selected cell (i) a selected word line voltage $V_{PGM}$ of approximately 5V to 8V is applied to word line WL4, (ii) a de-selected word line voltage of approximately 0V is applied to non-selected word lines WL1, WL2 and WL3, (iii) a selected bit line voltage of approximately 0V is applied to bit line BL1, (iv) a selected source line voltage of 0V is applied to source line SL1, (v) a de-selected bit line voltage $V_{INHIBIT}=0.5V_{PGM}$ is applied to non-selected bit line L2 and (vi) a de-selected source line voltage $V_{INHIBIT}=0.5V_{PGM}$ is applied to non-selected source line SL2. With the 3D AND flash memory structure described herein, a target program (write) speed of approximately 1 µs can be achieved.

Figure 6:
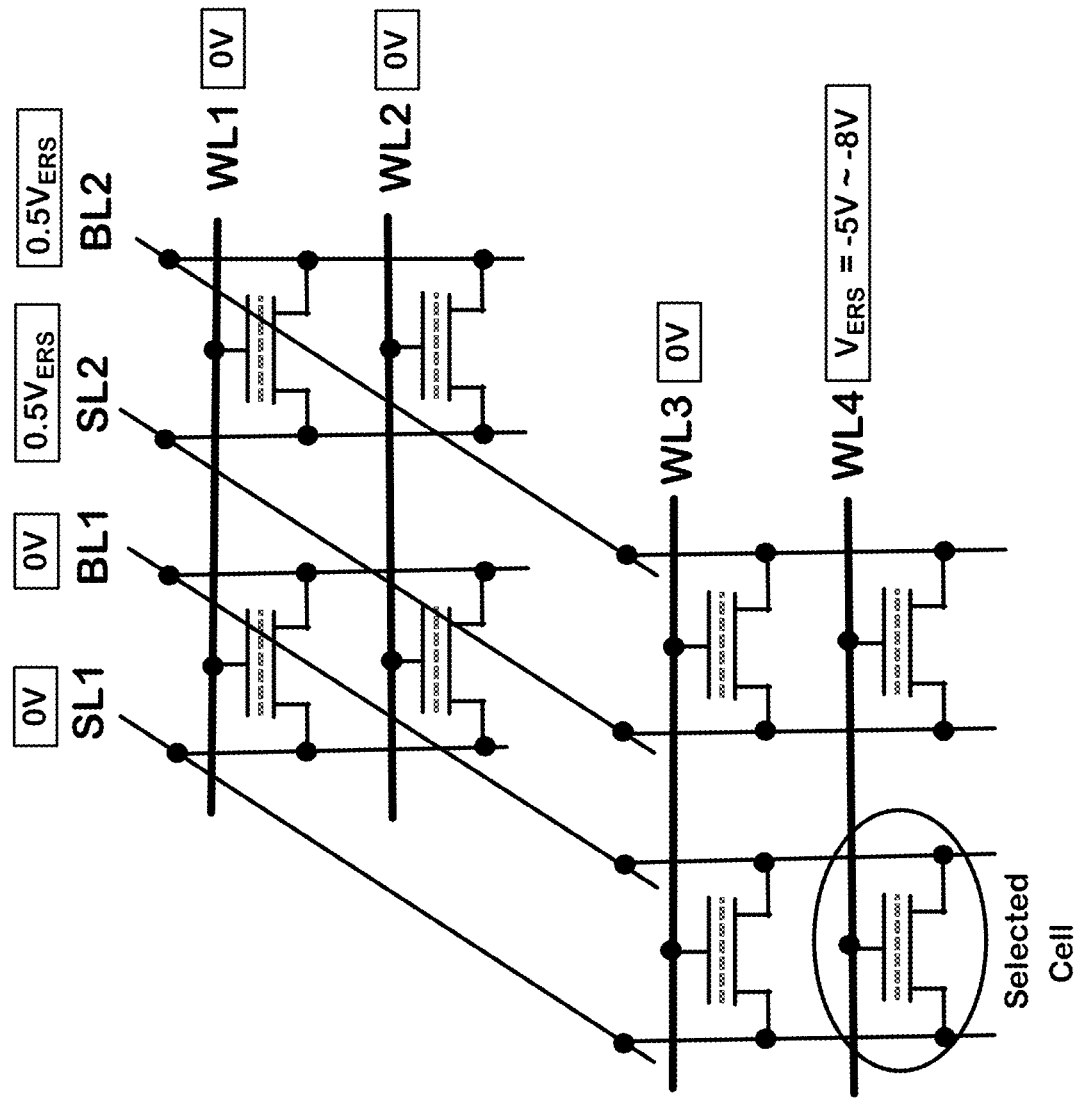
FIG. 6 illustrates various voltages applied to a 3D AND flash memory to perform an erase operation, according to an aspect of the technology disclosed.

FIG. 6 illustrates various voltages applied to a 3D AND flash memory to perform an erase operation, according to an aspect of the technology disclosed.

The 3D AND flash memory is configured to perform various operations, such as read, program (write) and erase. Controller circuitry is configured to provide specific electrical signals to various parts of the 3D AND flash memory in order to perform these various operations. The controller circuitry is illustrated in FIG. 15 and is discussed in more detail below.

FIG. 6 illustrates source line SL1, bit line BL1, source line SL2 and bit line BL2. Source line SL1 corresponds, for example, to an electrical connection to first conductive pillar 310 of FIG. 3 or corresponds to the first conductive pillar 310 itself. Bit line BL1 corresponds, for example, to an electrical connection to second conductive pillar 312 of FIG. 3 or corresponds to the second conductive pillar 312 itself.

Further, source line SL1 and bit line BL1 correspond to electrical connections to a first conductive pillar 310 and second conductive pillar 312 pair (or to the first conductive pillar 310 and second conductive pillar 312 pair itself) located within a particular elliptically shaped cylindrical channel pillar 308. In other words, source line SL1 and bit line BL1 are located within the same elliptically shaped cylindrical channel pillar 308.

Source line SL2 corresponds, for example, to an electrical connection to another first conductive pillar 310 of FIG. 3 or corresponds to the other first conductive pillar 310 itself. Bit line BL2 corresponds, for example, to an electrical connection to another second conductive pillar 312 of FIG. 3 or corresponds to the other second conductive pillar 312 itself. Further, source line SL2 and bit line BL2 correspond to electrical connections to another first conductive pillar 310 and second conductive pillar 312 pair (or to the other first conductive pillar 310 and second conductive pillar 312 pair itself) located within a another elliptically shaped cylindrical channel pillar 308. In other words, source line SL2 and bit line BL2 are located within the same elliptically shaped cylindrical channel pillar 308.

FIG. 4 also illustrates four word lines including WL1, WL2, WL3 and WL4. The four word lines correspond to electrical connections to various gate layers (e.g., gate layers 304 of FIG. 3) or to the gate layers themselves.

As illustrated in FIG. 6, a cell is selected for the erase operation. The selected cell of the 3D AND memory is located at the intersection of source line SL1, bit line BL1 and word line WL4. In order to perform an erase operation on the selected cell (i) a selected word line voltage $V_{ERS}$ of approximately −5V to −8V is applied to word line WL4, (ii) a de-selected word line voltage of approximately 0V is applied to non-selected word lines WL1, WL2 and WL3, (iii) a selected bit line voltage of approximately 0V is applied to bit line BL1, (iv) a selected source line voltage of 0V is applied to source line SL1, (v) a de-selected bit line voltage $V_{INHIBIT}$=0.5$V_{ERS}$ is applied to non-selected bit line BL2 and (vi) a de-selected source line voltage $V_{INHIBIT}$=0.5$V_{ERS}$ is applied to non-selected source line SL2. With the 3D AND flash memory structure described herein, a target erase speed of approximately 1 µs can be achieved.

In one aspect of the technology disclosed, an undesirably high negative bias at source line SL1 and bit line BL1 can be avoided. In this aspect of the technology disclosed, voltages are shifted (divided voltage scheme) to avoid the negative bias. For example, at $V_{ERS}$=−8V, voltages applied to the terminals are shifted +4V. For example, +4V can be applied to selected source line SL1 and selected bit line BL1, 0V can be applied to de-selected source line SL2 and de-selected bit line BL2, −4V can be applied to selected word line WL4 and +4V can be applied to de-selected word lines WL1, WL2 and WL3. This erase operation can be bit alterable.

Figure 7:
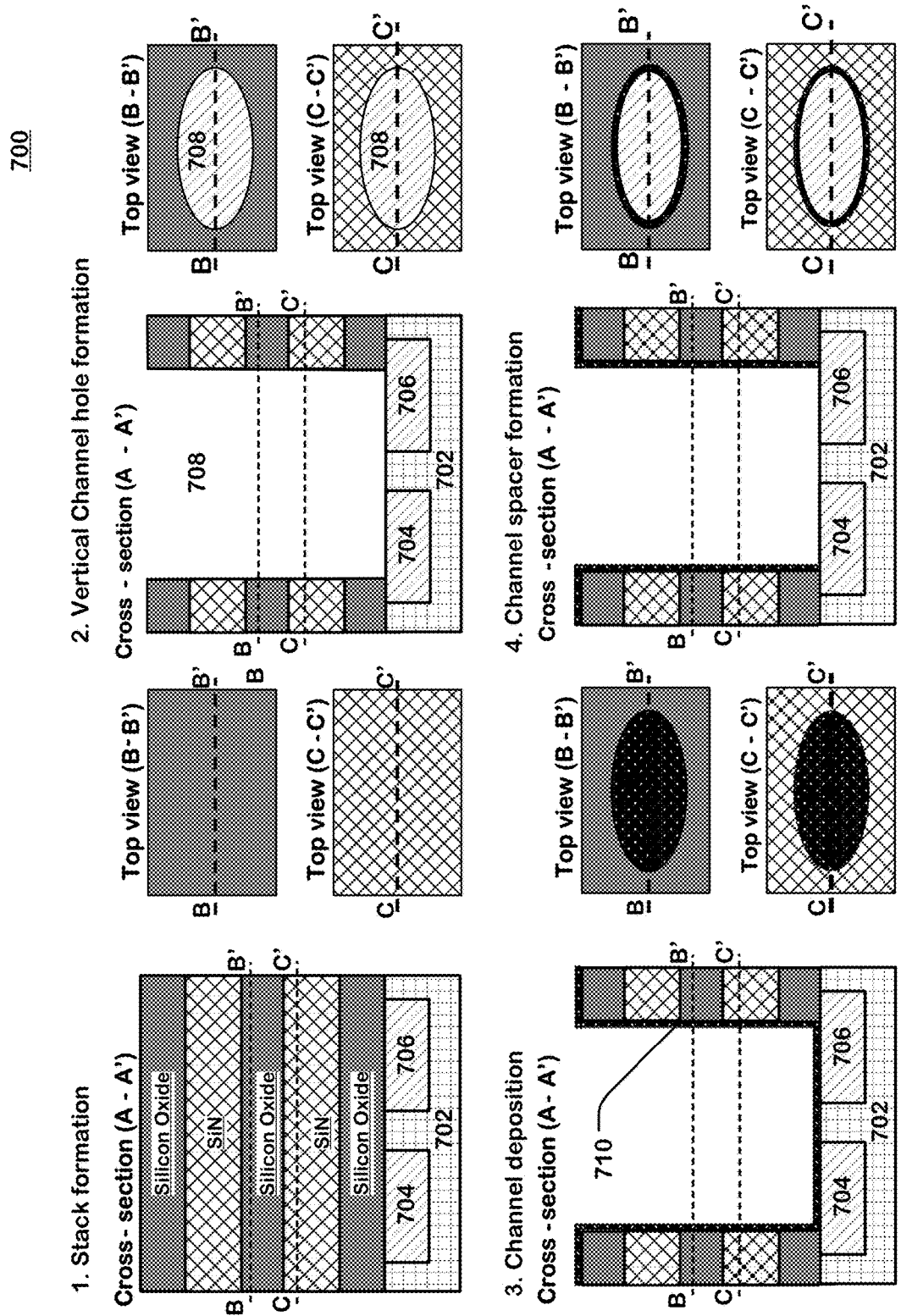
FIG. 7 illustrates various steps performed to manufacture a gate stack structure of a 3D AND flash memory according to a first process.

FIG. 7 illustrates various steps performed to manufacture a gate stack structure of a 3D AND flash memory according to a first process. The entire first process spans FIGS. 7-11. The resulting structure formed from the first process results in a structure that has a different ferroelectric layer formation when compared to the ferroelectric layer formation resulting from the structure formed by a (different) second process described in more detail below.

Process flow 700 of FIG. 7 includes four steps including (1) stack formation, (2) vertical channel hole formation, (3) channel deposition and (4) channel spacer formation. Each step includes a cross-section view A-A', a top view B-B' from one location and a top view C-C' from another location.

The stack formation step includes forming a stack that includes a dielectric layer (base) 702 having two electrical connections 704 and 706 disposed therein. The dielectric layer (base) 702, for example, can be a silicon oxide layer that is formed on a silicon substrate or it can be any other dielectric known to a person of ordinary skill in the art. The electrical connection 704 (e.g., a conductive plug) can be a first buried conductor (e.g., a buried source conductor) that is disposed horizontally under the stack and is eventually electrically connected to the source pillar (e.g., see first conductive pillar 210 of FIG. 2) and the electrical connection 706 (e.g., a conductive plug) can be a second buried conductor (e.g., a buried drain conductor) that is disposed horizontally under the stack and is eventually electrically connected to the drain pillar (e.g., see second conductive pillar 212 of FIG. 2). The electrical connection 704 can be referred to as a disposed first buried conductor that is connected to a first conductive pillar 210 and the electrical connection 706 can be referred to as a disposed second buried conductor that is connected to a second conductive pillar 212. The electrical connections 704 and 706 are comprised of polysilicon, metal of other conductive materials. The electrical connections 704 and 706 can be an etching stop layer.

The stack structure formed in the stack formation step further includes alternating layers of (i) an insulating layer such as, for example, silicon oxide and (ii) a sacrificial layer of, for example, silicon mononitride (SiN). The bottom silicon oxide layer can be referred to as a first layer, the adjacent SiN layer can be referred to as a second layer, the adjacent silicon oxide layer can be referred to as a third layer, the adjacent SiN layer can be referred to as a fourth layer and the adjacent silicon oxide layer can be referred to as a fifth layer. In FIG. 7, the stack structure has three insulating layers and two sacrificial layers, but the technology disclosed is not limited thereto. For example, more insulating layers and more sacrificial layers may be formed according to actual requirements. Further, as illustrated in the stack formation step, top view B-B' provides a top view of the insulating layer and top view C-C' provides a top view of the sacrificial layer The vertical channel hole formation step includes forming a vertical and elliptical channel hole 708 in the alternating layers. Top view B-B' and top view C-C' illustrate the elliptical cross-section of the vertical and elliptical channel hole 708.

The channel deposition step includes applying a channel layer 710 along the vertical walls of the five alternating layers and on top of the uppermost insulating layer. Specifically, the channel layer 710 can be applied by forming a channel material layer on a top face of an uppermost insulating layer and an inner surface and a bottom of the vertical and elliptical channel hole 708. The channel layer 710 can be, for example, an undoped polysilicon layer, or can be otherwise doped (e.g., lightly doped) for purposes of performing as a channel. Top view B-B' and top view C-C' illustrate the elliptical cross-section of the channel layer 710 and the vertical and elliptical channel hole 708.

The channel spacer step includes removing a portion of the channel layer 710 that is on the top of the uppermost insulating layer and removing a portion of the channel layer 710 that is on the bottom of the vertical and elliptical channel hole 708. This can be done by, for example, performing an anisotropic etching process to remove the channel layer 710 from the top of the uppermost insulation layer and the bottom of the vertical and elliptical channel hole 708. Top view B-B' and top view C-C' illustrate the fact that the channel layer 710 has been removed from the bottom of the vertical and elliptical channel hole 708.

Figure 8:
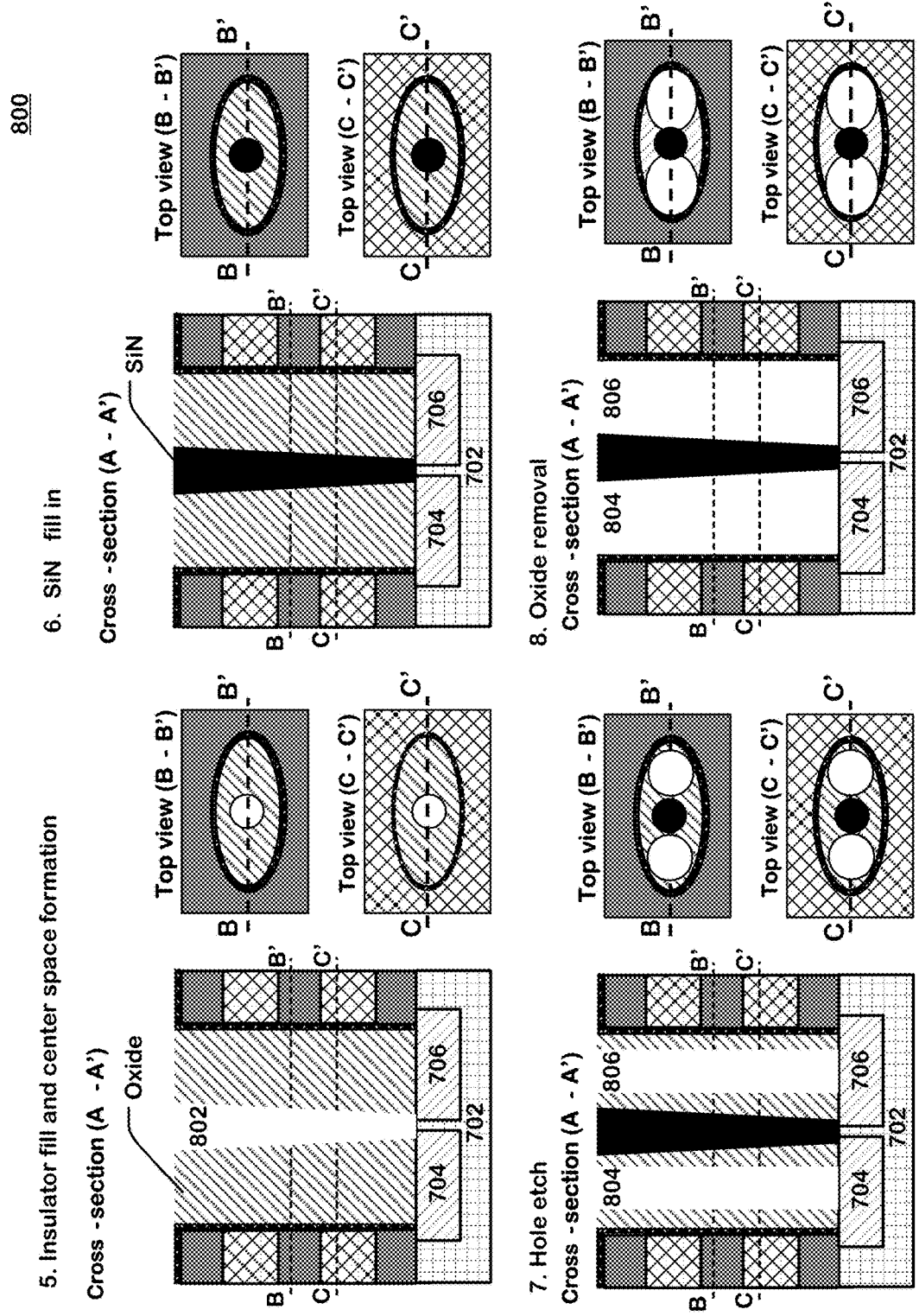
FIG. 8 illustrates various steps performed to manufacture a gate stack structure of a 3D AND flash memory according to a first process.

FIG. 8 illustrates various steps performed to manufacture a gate stack structure of a 3D AND flash memory according to the first process.

Specifically, FIG. 8 illustrates process flow 800, which continues the process illustrated in FIG. 7 and discussed above. Process flow 800 of FIG. 8 includes four steps including (5) insulator fill and center space formation, (6) SiN fill in, (7) hole etch and (8) oxide removal. Each step includes a cross-section view A-A', a top view B-B' from one location and a top view C-C' from another location.

The insulator fill and center space formation step includes depositing an insulator, such as, for example, oxide into the vertical and elliptical channel hole 708, while also leaving a center space 802 in the vertical and elliptical channel hole 708. The center space 802 can be, for example an annular hole with a diameter that reduces as the center space 802 gets closer to the dielectric layer 702. Top view B-B' and Top view C-C' illustrate the elliptical cross-sectional shape of the oxide within the vertical and elliptical channel hole 708 and also illustrate the circular or annular cross-sectional shape of the center space 802.

The SiN fill in step includes filling in the center space 802 with an insulator, such as SiN. This SiN can be referred to as a center column. The oxide insulator surrounds the center column. Top view B-B' and Top view C-C' illustrate the cross-sectional view of the SiN filled into the center space 802.

The hole etch step includes etching a hole 804 through the oxide layer and etching a hole 806 through the oxide layer. Top view B-B' and Top view C-C' illustrate the orientation of the hole 804, the hole 806 and the SiN with respect to one another.

The oxide removal step includes further removing portions of the oxide. Top view B-B' and Top view C-C' illustrate the additional portions of the oxide that are removed in this step. The step essentially expands the holes 804 and 806, such that the expanded holes reach the channel layer 710.

FIG. 9 illustrates various steps performed to manufacture a gate stack structure of a 3D AND flash memory according to the first process.

Specifically, FIG. 9 illustrates process flow 900, which continues the process illustrated in FIG. 8 and discussed above. Process flow 900 of FIG. 9 includes three steps including (9) Plug formation, (10) SiN stack removal and (11) formation of ferroelectric and TiN layers. Each step includes a cross-section view A-A', a top view B-B' from one location and a top view C-C' from another location.

The plug formation step includes disposing, for example, conductors such as a doped polysilicon layers 902 and 904 in the expanded holes formed in the oxide removal step of FIG. 8. The doped polysilicon layers 902 and 904 represent the first conductive pillar 210 and the second conductive pillar 212 of the 3D AND flash memory, as illustrated in FIG. 2. As illustrated in top view B-B' and top view C-C', the layers 902 and 904 are within the elliptical channel layer 710. Further, layers 902 and 904 are separated (insulated) from each other by the oxide and the SiN. Hereinafter, the layer 902 will be referred to as the first conductive pillar and layer 904 will be referred to as the second conductive pillar.

The SiN stack removal step includes removing the sacrificial layers from the stack to form openings 906, 908, 910 and 912. Top view B-B' and top view C-C' illustrate the differences in cross-sections that include the silicon oxide (see view B-B') and that include the openings 910 and 912 (see view C-C').

The formation of ferroelectric and TiN layers includes adding ferroelectric layers 914 inside the openings 906, 908, 910 and 912 and then adding TiN layers 916 inside the openings 906, 908, 910 and 912. The ferroelectric layers 914 may be comprised of a ferroelectric $HfO_2$ material or any other ferroelectric type material that is known to a person of ordinary skill in the art, and the TiN layers 916 may comprise other metal Nitride materials or other barrier materials such as TaN. Top view B-B' illustrates that the ferroelectric layers 914 and the TiN layers 916 are not present in the cross-section of the silicon oxide layer and top view C-C' illustrates that the ferroelectric layers 914 and the TiN layers 916 are present in the cross section taken from where the openings 910 and 912 were formed. As illustrated in top view C-C', one of the ferroelectric layers 914 is elliptical and contacts the channel layer and one of the TiN layers 916 is elliptical and contacts the ferroelectric layer 914.

Figure 10:
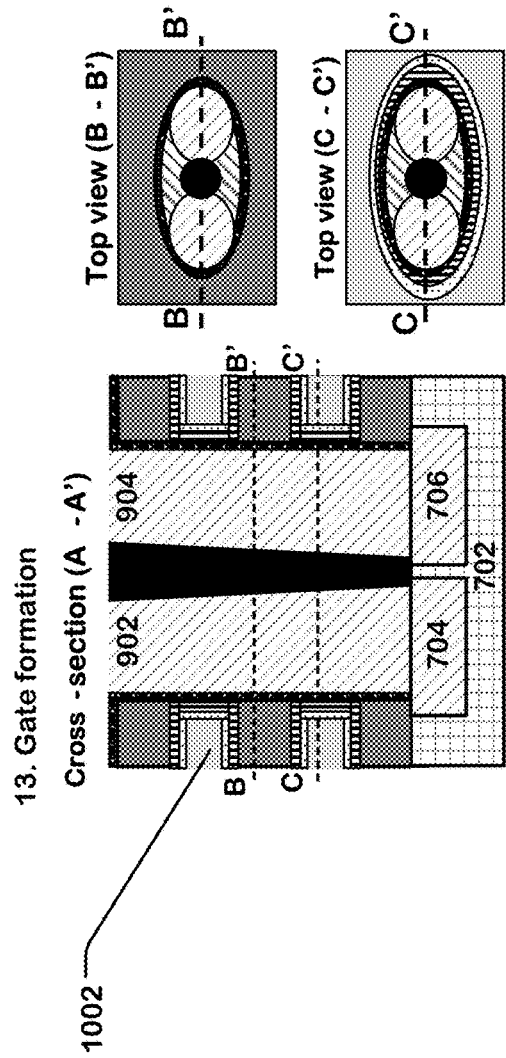
FIG. 10 illustrates a step performed to manufacture a gate stack structure of a 3D AND flash memory according to a first process.

FIG. 10 illustrates a step performed to manufacture a gate stack structure of a 3D AND flash memory according to the first process.

Specifically, FIG. 10 illustrates process flow 1000, which continues the process illustrated in FIG. 9 and discussed above. Process flow 1000 of FIG. 10 includes one step including (12) gate formation.

The gate formation step includes adding gate layers 1002 in the remaining spaces of the openings 906, 908, 910 and 912. As illustrated, the ferroelectric layer 914 is covers (in on) an upper surface and a lower surface of each gate layer 1002. The gate layers 1002 may comprise, for example, polysilicon, amorphous silicon, tungsten (W), cobalt (Co), aluminum (Al), tungsten silicide (WSix), or cobalt silicide (CoSix). In addition, in other embodiments, a barrier layer may be sequentially formed in the openings 906, 908, 910 and 912 before the gate layers 1002 are formed. The barrier layer can be made of, for example, titanium (Ti), titanium nitride (TiN), tantalum (Ta), tantalum nitride (TaN), or a combination thereof.

Top view B-B' and top view C-C' illustrate the different layers surrounding the channel layer 710 from the cross-section of a silicon oxide layer and the cross-section of a gate layer 1002.

Figure 11:
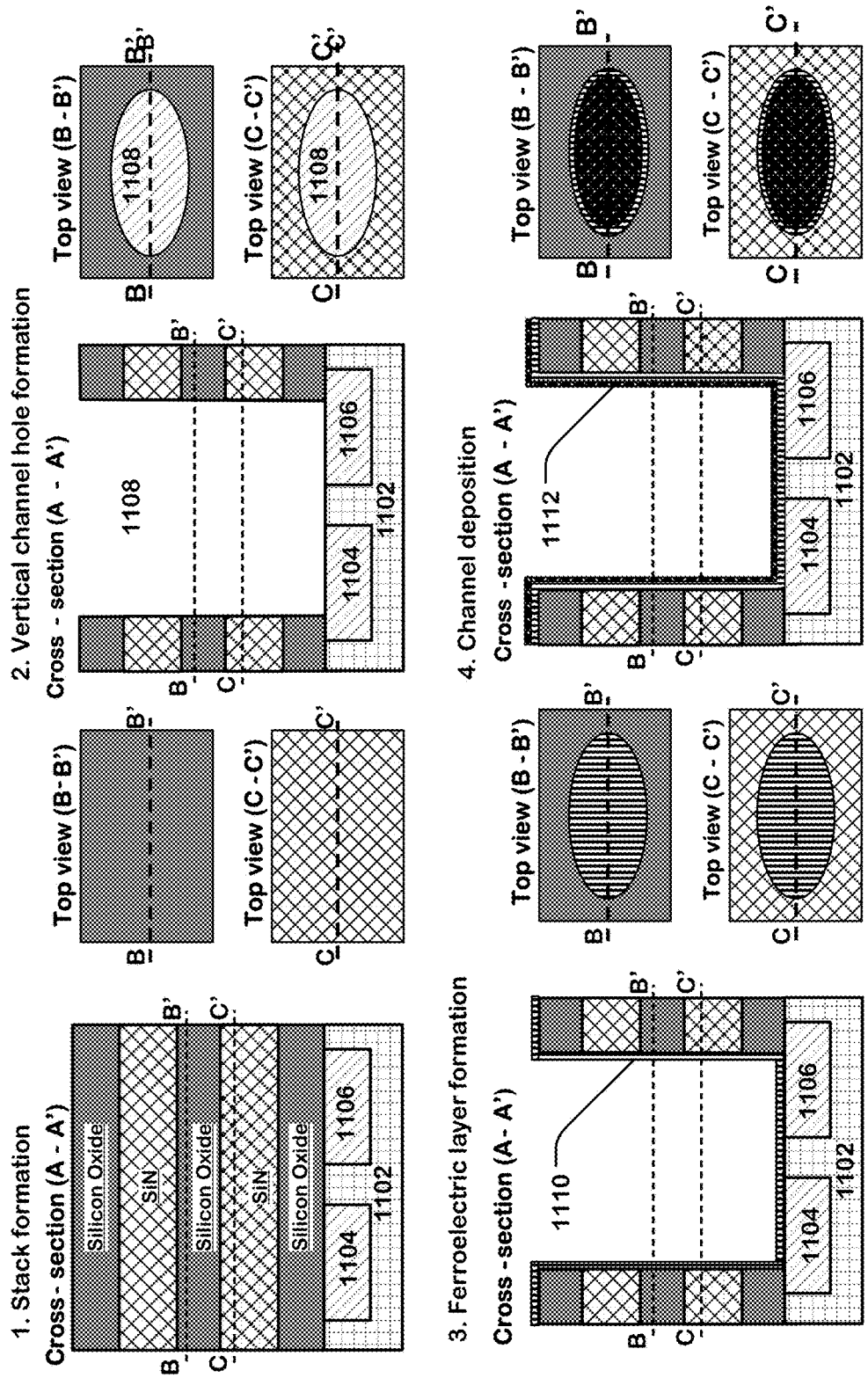
FIG. 11 illustrates various steps performed to manufacture a gate stack structure of a 3D AND flash memory according to a second process.

FIG. 11 illustrates various steps performed to manufacture a gate stack structure of a 3D AND flash memory according to a second process.

The resulting structure formed from the second process results in a structure that has a different ferroelectric layer formation when compared to the ferroelectric layer formation resulting from the structure formed by the first process.

Process flow 1100 of FIG. 11 includes 4 steps including (1) stack formation, (2) vertical channel hole formation, (3) ferroelectric layer formation and (4) channel deposition. Each step includes a cross-section view A-A', a top view B-B' from one location and a top view C-C' from another location.

The stack formation step includes forming a stack that includes a dielectric layer (base) 1102 having two electrical connections 1104 and 1106 disposed therein. The dielectric layer (base) 1102, for example, is a silicon oxide layer that is formed on a silicon substrate. The electrical connection 1104 can be a source conductor that is disposed horizontally under the stack and is eventually electrically connected to the source pillar (e.g., see first conductive pillar 210 of FIG. 2) and the electrical connection 1106 can be a drain conductor that is disposed horizontally under the stack and is eventually electrically connected to the drain pillar (e.g., see second conductive pillar 212 of FIG. 2). The electrical connection 1104 can be referred to as a disposed first buried conductor that is connected to a first conductive pillar 210 and the electrical connection 1106 can be referred to as a disposed second buried conductor that is connected to a second conductive pillar 212. The electrical connections 1104 and 1106 are comprised of polysilicon, metal of other conductive materials.

The stack structure formed in the stack formation step further includes alternating layers of (i) an insulating layer such as, for example, silicon oxide and (ii) a sacrificial layer of, for example, silicon mononitride (SiN). In FIG. 11, the stack structure has three insulating layers and two sacrificial layers, but the technology disclosed is not limited thereto. For example, more insulating layers and more sacrificial layers may be formed according to actual requirements. Further, as illustrated in the stack formation step, top view B-B' provides a top view of the insulating layer and top view C-C' provides a top view of the sacrificial layer The vertical channel hole formation step includes forming a vertical and elliptical channel hole 1108 in the alternating layers. Top view B-B' and top view C-C' illustrate the elliptical cross-section of the vertical and elliptical channel hole 1108.

The ferroelectric layer formation step includes applying a ferroelectric layer 1108 along the vertical walls of the five alternating layers and on top of the uppermost insulating layer. Specifically, the ferroelectric layer 1110 can be applied by forming a ferroelectric material layer on a top face of an uppermost insulating layer and an inner surface and a bottom of the vertical and elliptical channel hole 1108. The ferroelectric layer 1110 can be, for example a ferroelectric $HfO_2$ material or any other ferroelectric type material that is known to a person of ordinary skill in the art. Top view B-B' and top view C-C' illustrate the elliptical cross-section of the ferroelectric layer 1110 and the vertical and elliptical channel hole 1108.

The channel deposition step includes applying a channel layer 1112 along the ferroelectric layer 1110. Specifically, the channel layer 1112 can be applied by forming a channel material over the ferroelectric layer 1110, such that it is located on a top face of an uppermost insulating layer and an inner surface and a bottom of the vertical and elliptical channel hole 1108. The channel layer 1112 can be, for example, an undoped polysilicon layer, or can be otherwise doped (e.g., lightly doped) for purposes of performing as a channel. Top view B-B' and top view C-C' illustrate the elliptical cross-section of the ferroelectric layer 1110, the channel layer 1112 and the vertical and elliptical channel hole 1108. As illustrated, the ferroelectric layer 1110 covers/surrounds an outer surface of the channel layer 1112.

Figure 12:
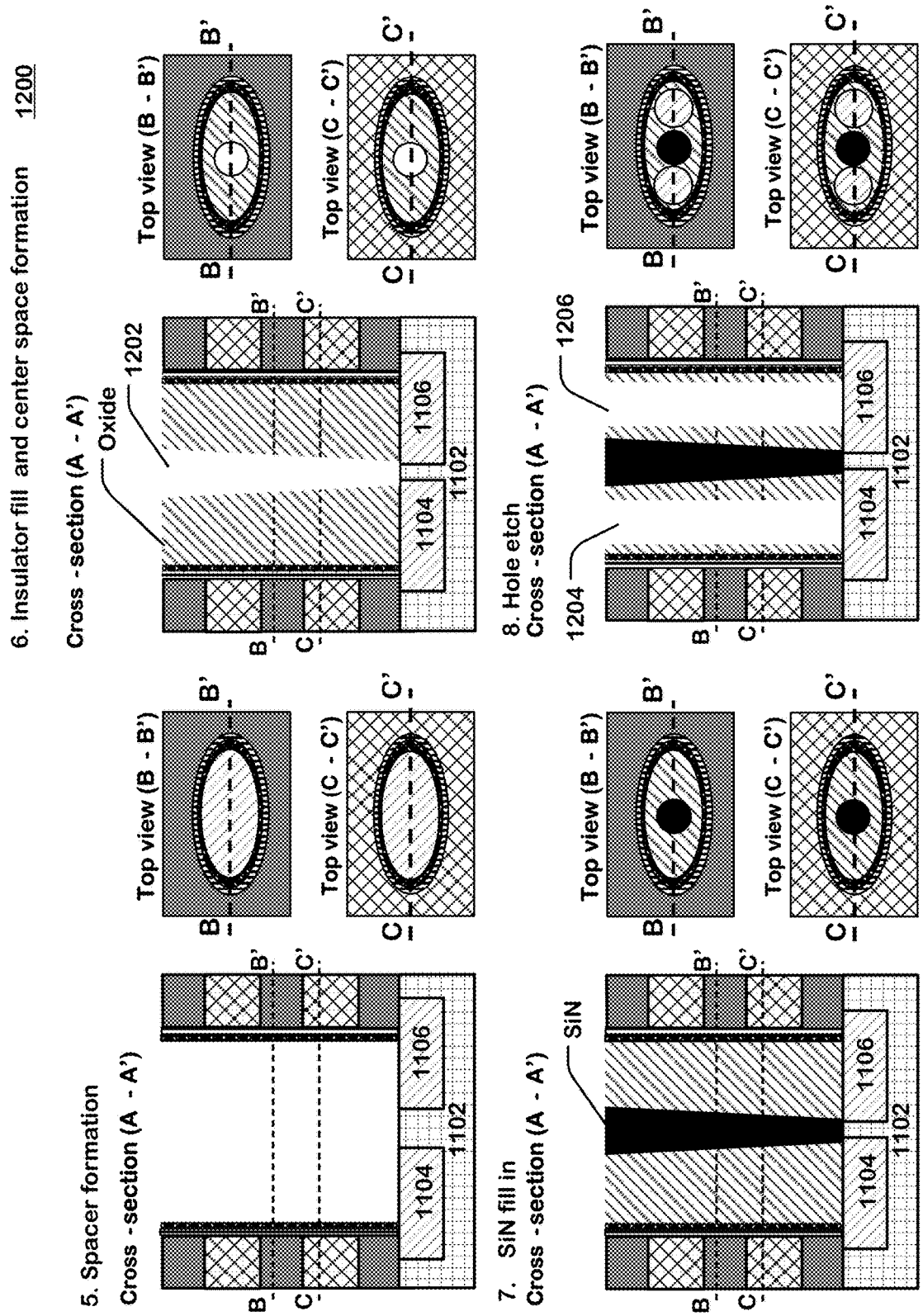
FIG. 12 illustrates various steps performed to manufacture a gate stack structure of a 3D AND flash memory according to a second process.

FIG. 12 illustrates various steps performed to manufacture a gate stack structure of a 3D AND flash memory according to the second process.

Specifically, FIG. 12 illustrates process flow 1200, which continues the process illustrated in FIG. 12 and discussed above. Process flow 1200 of FIG. 12 includes four steps including (5) spacer formation, (6) insulator fill and center space formation, (7) SiN fill in and (8) hole etch. Each step includes a cross-section view A-A', a top view B-B' from one location and a top view C-C' from another location.

The channel spacer step includes removing a portion of the ferroelectric layer 1110 and the channel layer 1112 that is on the top of the uppermost insulating layer and removing a portion of ferroelectric layer 1110 and the channel layer 1112 that is on the bottom of the vertical and elliptical channel hole 1108. This can be done by, for example, performing an anisotropic etching process to remove the ferroelectric layer 1110 and the channel layer 1112 from the top of the uppermost insulation layer and the bottom of the vertical and elliptical channel hole 1108. Top view B-B' and top view C-C' illustrate the fact that the ferroelectric layer 1110 and the channel layer 1112 have been removed from the bottom of the vertical and elliptical channel hole 1108. As illustrated, the ferroelectric layer 1110 covers an outer surface of the channel layer 1112 (e.g., the elliptically shaped cylindrical channel pillar 206 of FIG. 2).

The insulator fill and center space formation step includes depositing an insulator, such as, for example, oxide into the vertical and elliptical channel hole 1108, while also leaving a center space 1202 in the vertical and elliptical channel hole 1108. The center space 1202 can be, for example an annular hole with a diameter that reduces as the center space 1202 gets closer to the dielectric layer (base) 1102. Top view B-B' and Top view C-C' illustrate the elliptical cross-sectional shape of the oxide within the vertical and elliptical channel hole 1108 and also illustrate the circular or annular cross-sectional shape of the center space 1202.

The SiN fill in step includes filling in the center space 1202 with an insulator, such as SiN. Top view B-B' and Top view C-C' illustrate the cross-sectional view of the SiN filled into the center space 1202.

The hole etch step includes etching a hole 1204 through the oxide layer and etching a hole 1206 through the oxide layer. Top view B-B' and Top view C-C' illustrate the orientation of the hole 1204, the hole 1206 and the SiN with respect to one another.

Figure 13:
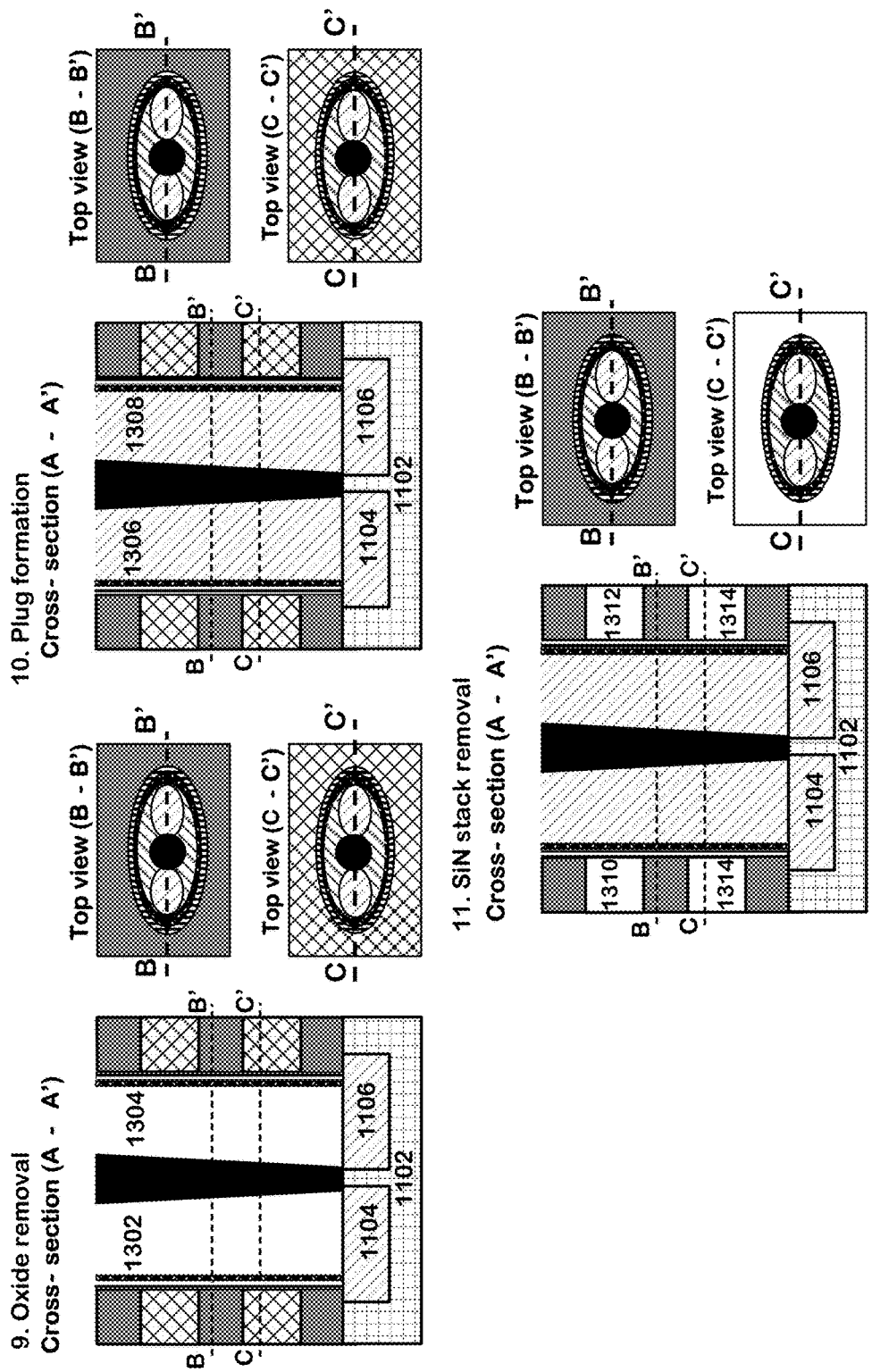
FIG. 13 illustrates various steps performed to manufacture a gate stack structure of a 3D AND flash memory according to a second process.

FIG. 13 illustrates various steps performed to manufacture a gate stack structure of a 3D AND flash memory according to the second process.

Specifically, FIG. 13 illustrates process flow 1300, which continues the process illustrated in FIG. 12 and discussed above. Process flow 1300 of FIG. 13 includes three steps including (9) oxide removal, (10) Plug formation and (11) SiN stack removal. Each step includes a cross-section view A-A', a top view B-B' from one location and a top view C-C' from another location.

The oxide removal step includes further removing portions of the oxide. Top view B-B' and Top view C-C' illustrate the additional portions of the oxide that are removed in this step. The step essentially expands the holes 1204 and 1206 to form expanded holes 1302 and 1304, such that the expanded holes reach the channel layer 1112.

The plug formation step includes disposing, for example, conductors such as a doped polysilicon layers 1306 and 1308 the expanded holes 1302 and 1304 formed in the oxide removal step. The doped polysilicon layers 1306 and 1308 represent the first conductive pillar 210 and the second conductive pillar 212 of the 3D AND flash memory, as illustrated in FIG. 2. As illustrated in top view B-B' and top view C-C', the layers 1306 and 1308 are within the elliptical channel layer 1112. Further, layers 1306 and 1308 are separated (insulated) from each other by the oxide and the SiN. Hereinafter, the layer 1306 will be referred to as the first conductive pillar and layer 1308 will be referred to as the second conductive pillar.

The SiN stack removal step includes removing the sacrificial layers from the stack to form openings 1310, 1312, 1314 and 1316. Top view B-B' and top view C-C' illustrate the differences in cross-sections that include the silicon oxide (see view B-B') and that include the openings 1314 and 1316 (see view C-C').

Figure 14:
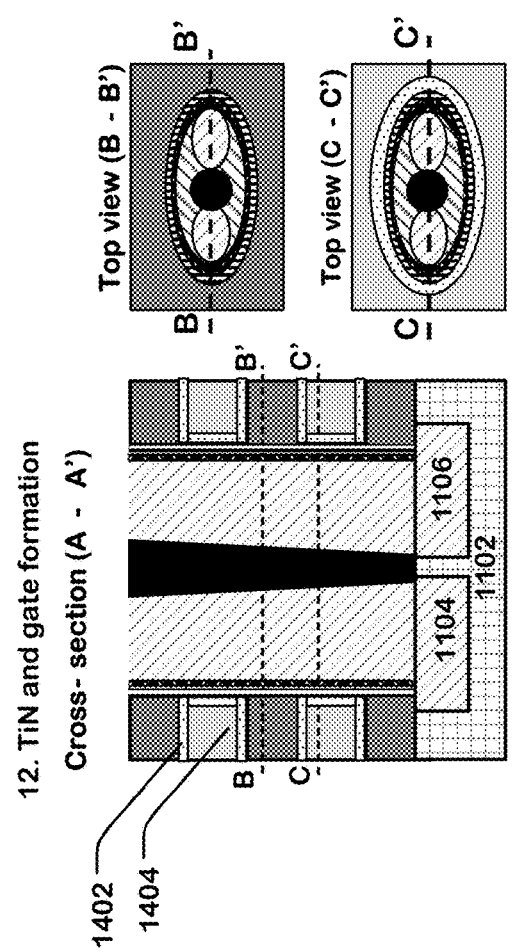
FIG. 14 illustrates a step performed to manufacture a gate stack structure of a 3D AND flash memory according to a second process.

FIG. 14 illustrates a step performed to manufacture a gate stack structure of a 3D AND flash memory according to the second process.

Specifically, FIG. 14 illustrates process flow 1400, which continues the process illustrated in FIG. 13 and discussed above. Process flow 1400 of FIG. 14 includes one step including (12) TiN and gate formation.

The formation TiN layers includes adding TiN layers 1402 inside the openings 1310, 1312, 1314 and 1316. The TiN layers 916 may comprise other metal Nitride materials or other barrier materials, such as TaN. Top view B-B' illustrates that the ferroelectric layers 1110 and the TiN layers 1402 are not present in the cross-section of the silicon oxide layer and top view C-C' illustrates that the ferroelectric layers 1110 and the TiN layers 1404 are present in the cross section taken from where the openings 1314 and 1316 were formed. As illustrated in top view C-C', one of the ferroelectric layers 1110 is elliptical and contacts the channel layer 1112 and one of the TiN layers 1402 is elliptical and contacts the ferroelectric layer 1110.

The gate formation step includes adding gate layers 1404 in the remaining spaces of the openings 1310, 1312, 1314 and 1316. The gate layers 1404 may comprise, for example, polysilicon, amorphous silicon, tungsten (W), cobalt (Co), aluminum (Al), tungsten silicide (WSix), or cobalt silicide (CoSix). In addition, in other embodiments, a barrier layer may be sequentially formed in the openings 1310, 1312, 1314 and 1316 before the gate layers 1404 are formed. The barrier layer can be made of, for example, titanium (Ti), titanium nitride (TiN), tantalum (Ta), tantalum nitride (TaN), or a combination thereof.

Top view B-B' and top view C-C' illustrate the different layers surrounding the channel layer 1112 from the cross-section of a silicon oxide layer and the cross-section of a gate layer 1404.

FIG. 15 illustrates a simplified block diagram of a gate stack structure of a 3D AND flash memory, host and a controller configured to perform operations on the 3D AND flash memory.

FIG. 15 is a simplified diagram of a memory system 1500 that includes a 3D AND flash memory device 1508 implemented on an integrated circuit and a host 1502 configured for memory operations, including page program, program, read, erase, or other operations. In various embodiments, the memory device 1508 may have single-level cells (SLC), or multiple-level cells storing more than one bit per cell (e.g., MLC, TLC or XLC). The memory device 1508 can be implemented on a single integrated circuit chip, on a multichip module, or on a plurality of chips configured as suits a particular need.

The memory device 1508 includes a memory array 1578, which can be a 3D AND flash memory implemented using three-dimensional array technology, such as the structures described above with reference to FIGS. 1-14. In some embodiments, the memory array 1578 comprises an array of vertical AND pillars in a dense 3D configuration. In other embodiments the memory array 1578 can comprise a two-dimensional array of AND pillars.

A word line decoder 1576A is coupled via word line driver circuits 1576B to a plurality of word lines 1577 in the memory array 1578. Page buffer circuits 1538 are coupled by bit line driver circuits 1548 to bit lines 1566 in the memory array 1578. In some embodiments, column decoder circuits can be included for routing data from the bit line drivers to selected bit lines. The page buffer circuits 1538 can store pages of data that define a data pattern for a page program operation, and can include sensing circuits used in read and verify operations Bit lines for memory arrays can comprise global bit lines (GBL) and local bit lines. Bit lines generally comprise conductors in higher patterned layers that traverse a plurality of blocks of memory cells in an array and connect to local bit lines in the blocks via block select transistors or bank select transistors. The local bit lines are connected to the memory cells for current flow to and from the bit lines, which in turn are connected to the bit line driver circuits 1548 and page buffer circuits 1538. Likewise, the word lines can include global word lines and local word lines with corresponding supporting circuits in the word line drivers 1576B.

In a sensing operation, sensed data from the page buffer circuits 1538 are supplied via second data lines in bus system 1526 to cache circuits 1528, which are in turn coupled to input/output circuits 1518 via data path lines 1516. Also, input data is applied in this example to the cache circuits 1528 on lines 1516, and to the page buffer circuits 1538 on bus system 1526, for use in support of program operations.

Input/output circuits 1518 are connected by line 1514 (including I/O pads) and provide communication paths for the data, addresses and commands with destinations external to the memory device 1508, including the host 1502 in this example. The input/output circuits 1518 provide a communication path by line 1516 to cache circuits 1528 which support memory operations. The cache circuits 1528 are in data flow communication (using for example a bus system 1526) with page buffer circuits 1538.

Control circuits 1534 are connected to the input/output circuits 1518, and include command decoder logic, address counters, state machines, timing circuits and other logic circuits that control various memory operations, including program, read, and erase operations for the memory array 1578. For example, with reference to FIGS. 1-14 and the descriptions thereof, the control circuits 1534 are configured to (i) provide various voltages to a selected word line connected to a selected gate layer of a gate stack structure of the 3D flash memory, (ii) provide various voltages to a selected bit line connected to the second conductive pillar within the elliptically shaped cylindrical channel pillar of the 3D flash memory, and (iii) provide various voltages to a selected source line connected to the first conductive pillar within the elliptically shaped cylindrical channel pillar of the 3D flash memory.

Control circuit signals are distributed to circuits in memory device, as shown by arrows 1545, 1546, as required to support the operations of the circuits. The control circuits 1534 can include address registers and the like for delivery of addresses as necessary to the components of the memory device 1508, including delivery to the cache circuits 1528, and on line 1544 to the page buffer circuits 1538 and word line decoder 1576A in this illustration.

In the example shown in FIG. 15, control circuits 1534 include control logic circuits that include modules implementing a bias arrangement state machine, or machines, which controls, or control, the application of bias voltages generated or provided through the voltage supply or supplies in block 1564, such as read, erase, verify and program voltages including precharge voltages, pass voltages and other bias voltages as described herein to word line driver circuits 1576B and bit line driver circuits 1548, for a set of selectable program and read operations. Bias voltages are applied as represented by arrow 1565, to components of the memory device 1508, as necessary for support of the operations. As described in more detail below, the control circuits 1534 provide appropriate signals (e.g., voltages) to perform the various read, write and erase operations described above with respect to FIGS. 4-6.

The control circuits 1534 can include modules implemented using special-purpose logic circuitry including state machines, as known in the art. In alternative embodiments, the control circuits 1534 can include modules implemented using a general-purpose processor, which can be implemented on the same integrated circuit, which execute a computer program to control the operations of the memory device 1508. In yet other embodiments, a combination of special-purpose logic circuitry and a general-purpose processor can be utilized for implementation of modules in control circuits 1534.

The 3D AND flash memory array 1578 can comprise floating gate memory cells or dielectric charge trapping memory cells configured to store multiple bits per cell, by the establishment of multiple program levels that correspond to amounts of charge stored, which in turn establish memory cell threshold voltages Vt. The technology can be used with single-bit-per-cell flash memory, and with other multiple-bit-per-cell and single-bit-per-cell memory technologies. In other examples, the memory cells may comprise programmable resistance memory cells, phase change memory cells, and other types of non-volatile and volatile memory cell technologies.

In the illustrated example, the host 1502 is coupled to lines 1514 on the memory device 1508, as well as other control terminals not shown, such as chip select terminals and so on, and can provide commands or instructions to the memory device 1508. In some examples, the host 1502 can be coupled to the memory device using a serial bus technology, using shared address and data lines. The host 1502 can comprise a general-purpose processor, a special purpose processor, a processor configured as a memory controller, or other processor that uses the memory device 1508. All or part of the host 1502 can be implemented on the same integrated circuit as the memory.

The host 1502 can include a file system or file systems that store, retrieve, and update data stored in the memory based on requests from an application program. In general, the host 1502 can include programs that perform memory management functions and other functions that can produce status information for data stored in the memory, including information marking data invalid as a result of such functions. Such functions can include for example wear leveling, bad block recovery, power loss recovery, garbage collection, error correction, and so on. Also, the host 1502 can include application programs, file systems, flash translation layer programs and other components that can produce status information for data stored in the memory, including information marking data invalid as a result of such functions.

In high density memory, a page can comprise hundreds or thousands of bits, and a page buffer can be connected in parallel to the corresponding hundreds or thousands of bit lines. During program operations, for example, one set of bit lines and a word line are selected to be biased for programming a particular data pattern that is defined by contents of the page buffer circuits 1538, and a different set of bit lines is selected to be biased to inhibit programming according to the particular data pattern.

Other implementations of the method described in this section can include a non-transitory computer readable storage medium storing instructions executable by a processor to perform any of the methods described above. Yet another implementation of the method described in this section can include a system including memory and one or more processors operable to execute instructions, stored in the memory, to perform any of the methods described above.

Any data structures and code described or referenced above are stored according to many implementations on a computer-readable storage medium, which may be any device or medium that can store code and/or data for use by a computer system. This includes, but is not limited to, volatile memory, non-volatile memory, application-specific integrated circuits (ASICs), field-programmable gate arrays (FPGAs), magnetic and optical storage devices such as disk drives, magnetic tape, CDs (compact discs), DVDs (digital versatile discs or digital video discs), or other media capable of storing computer-readable media now known or later developed.

A number of flowcharts illustrating logic executed by a memory controller or by memory device are described herein. The logic can be implemented using processors programmed using computer programs stored in memory accessible to the computer systems and executable by the processors, by dedicated logic hardware, including field programmable integrated circuits, and by combinations of dedicated logic hardware and computer programs. With all flowcharts herein, it will be appreciated that many of the steps can be combined, performed in parallel or performed in a different sequence without affecting the functions achieved. In some cases, as the reader will appreciate, a re-arrangement of steps will achieve the same results only if certain other changes are made as well. In other cases, as the reader will appreciate, a re-arrangement of steps will achieve the same results only if certain conditions are satisfied. Furthermore, it will be appreciated that the flow charts herein show only steps that are pertinent to an understanding of the invention, and it will be understood that numerous additional steps for accomplishing other functions can be performed before, after and between those shown.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A 3D flash memory, comprising:
   a gate stack structure comprising a plurality of gate layers electrically insulated from each other;
   a cylindrical channel pillar vertically extending through each gate layer of the gate stack structure;
   a first conductive pillar vertically extending through the gate stack structure, the first conductive pillar being located within the cylindrical channel pillar and being electrically connected to the cylindrical channel pillar;
   a second conductive pillar vertically extending through the gate stack structure, the second conductive pillar being located within the cylindrical channel pillar and being electrically connected to the cylindrical channel pillar, the first conductive pillar and the second conductive pillar being separated from each other; and
   a ferroelectric layer disposed between gate layers of the gate stack structure and the cylindrical channel pillar.

2. The 3D flash memory according to claim 1, wherein an insulating pillar is disposed within the cylindrical channel pillar and between the first conductive pillar and the second conductive pillar.

3. The 3D flash memory according to claim 1,
wherein a first buried conductor is disposed horizontally under the gate stack structure and is electrically connected to the first conductive pillar, and
wherein a second buried conductor is disposed horizontally under the gate stack structure and is electrically connected to the second conductive pillar.

4. The 3D flash memory according to claim 1, wherein the ferroelectric layer vertically extends through the gate stack structure.

5. The 3D flash memory according to claim 1, wherein the ferroelectric layer is on an upper surface and a lower surface of a gate layer of the plurality of gate layers.

6. The 3D flash memory according to claim 1, wherein the ferroelectric layer surrounds an outer surface of the cylindrical channel pillar.

7. The 3D flash memory according to claim 1, wherein the cylindrical channel pillar is continuous in a vertical direction.

8. The 3D flash memory of claim 1, wherein the ferroelectric layer is comprised of a ferroelectric $HfO_2$ material.

9. The 3D flash memory of claim 1, further comprising:
an insulator disposed between the first conductive pillar and the second conductive pillar and extending along a length of the first conductive pillar and the second conductive pillar, the insulator separating the first conductive pillar and the second conductive pillar from one another.

10. The 3D flash memory of claim 1, further comprising:
a first buried conductor disposed in a dielectric base onto which the gate stack structure is disposed and connected to the first conductive pillar;
a second buried conductor disposed in the dielectric base and connected to the second conductive pillar; and
a control circuit configured to perform a program operation on the 3D flash memory by:
providing a voltage $V_{PGM}$ of approximately +5 volts to +8 volts on a selected word line connected to a selected gate layer of the plurality of gate layers;
providing a voltage of approximately 0 volts on a selected source line connected to the first buried conductor connected to the first conductive pillar within the cylindrical channel pillar; and
providing a voltage of approximately 0 volts on a selected bit line connected to the second buried conductor connected to the second conductive pillar within the cylindrical channel pillar.

11. The 3D flash memory of claim 1, further comprising:
a control circuit configured to perform an erase operation on the 3D flash memory by:
providing a voltage $V_{ERS}$ of approximately −5 volts to −8 volts on a selected word line connected to a selected gate layer of the plurality of gate layers;
providing a voltage of approximately 0 volts on a selected source line connected to the first conductive pillar within the cylindrical channel pillar; and
providing a voltage of approximately 0 volts on a selected bit line connected to the second conductive pillar within the cylindrical channel pillar.

12. The 3D flash memory of claim 11, further comprising a second cylindrical channel pillar having a same structure and arrangement as the cylindrical channel pillar,
wherein the control circuit is further configured to perform the erase operation on the 3D flash memory by:
providing a voltage of approximately 0 volts to deselected word lines connected to gate layers of the plurality of gate layers, except for the selected gate layer;
providing a voltage of approximately $(0.5) \times (V_{ERS})$ volts to a deselected source line connected to a third conductive pillar within the second cylindrical channel pillar; and
providing a voltage of approximately $(0.5) \times (V_{ERS})$ volts to a deselected bit line connected to a fourth conductive pillar within the second cylindrical channel pillar.

13. The 3D flash memory of claim 1, further comprising:
a second cylindrical channel pillar having a same structure and arrangement as the cylindrical channel pillar;
a third conductive pillar having a same structure and arrangement as the first conductive pillar;
a fourth conductive pillar having a same structure and arrangement as the second conductive pillar; and
a control circuit configured to perform a read operation on the 3D flash memory by:
providing a voltage of approximately +2 volts to +4 volts on a selected word line connected to a selected gate layer of the plurality of gate layers;
providing a voltage of approximately 0 volts on selected and deselected source lines connected to the first conductive pillar within the cylindrical channel pillar and connected to the third conductive pillar within the second cylindrical channel pillar; and
providing a voltage of approximately +0.5 volts to +1.5 volts on a selected bit line connected to the first conductive pillar within the cylindrical channel pillar.

14. The 3D flash memory of claim 13, wherein the control circuit is further configured to perform the read operation on the 3D flash memory by:
providing a voltage of approximately 0 volts to −2 volts to deselected word lines connected to gate layers of the plurality of gate layers, except for the selected gate layer; and
providing a voltage of approximately 0 volts to a deselected bit line connected to the fourth conductive pillar within the second cylindrical channel pillar.

15. The 3D flash memory of claim 1, wherein the cylindrical channel pillar is elliptically shaped.

16. A control circuit configured to program, erase and read a 3D flash memory, wherein the 3D flash memory comprises:
a gate stack structure comprising a plurality of gate layers electrically insulated from each other;
a cylindrical channel pillar vertically extending through each gate layer of the gate stack structure;
a first conductive pillar vertically extending through the gate stack structure, the first conductive pillar being located within the cylindrical channel pillar and being electrically connected to the cylindrical channel pillar;
a second conductive pillar vertically extending through the gate stack structure, the second conductive pillar being located within the cylindrical channel pillar and being electrically connected to the cylindrical channel pillar, the first conductive pillar and the second conductive pillar being separated from each other; and
a ferroelectric layer disposed between gate layers of the gate stack structure and the cylindrical channel pillar, and
wherein the control circuit is configured to variously perform program, erase and read operations by:

providing various voltages to a selected word line connected to a selected gate layer of the gate stack structure of the 3D flash memory;

providing various voltages to a selected bit line connected to the second conductive pillar within the cylindrical channel pillar of the 3D flash memory; and providing various voltages to a selected source line connected to the first conductive pillar within the cylindrical channel pillar of the 3D flash memory.

17. A method of forming a gate stack including a dielectric layer and a ferroelectric layer, the method comprising:

forming a gate stack structure comprising a plurality of gate layers electrically insulated from each other;

forming a cylindrical channel pillar vertically extending through each gate layer of the gate stack structure;

forming a first conductive pillar vertically extending through the gate stack structure, the first conductive pillar being located within the cylindrical channel pillar and being electrically connected to the cylindrical channel pillar;

forming a second conductive pillar vertically extending through the gate stack structure, the second conductive pillar being located within the cylindrical channel pillar and being electrically connected to the cylindrical channel pillar;

forming an insulating pillar disposed within the cylindrical channel pillar and between the first conductive pillar and the second conductive pillar; and forming a ferroelectric layer disposed between gate layers of the gate stack structure and the cylindrical channel pillar.

18. The method of claim 17, wherein the ferroelectric layer vertically extends through the gate stack structure.

19. The method of claim 17, wherein a cross-section of the ferroelectric layer is an elliptical cylinder, and wherein the ferroelectric layer surrounds an outer surface of the cylindrical channel pillar.

20. The method of claim 17, further comprising:

disposing a first buried conductor in a dielectric base onto which the gate stack structure is disposed, the first buried conductor being connected to the first conductive pillar; and disposing a second buried conductor in the dielectric base, the second buried conductor being connected to the second conductive pillar.

* * * * *